(12) United States Patent
Moriwaki

(10) Patent No.: US 8,780,310 B2
(45) Date of Patent: Jul. 15, 2014

(54) DISPLAY DEVICE HAVING HIGHER-LAYER WIRING THAT DOES NOT OVERLAP CONNECTION PORTION

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 498 days.

(21) Appl. No.: 13/131,385

(22) PCT Filed: Jul. 1, 2009

(86) PCT No.: PCT/JP2009/062061
§ 371 (c)(1),
(2), (4) Date: May 26, 2011

(87) PCT Pub. No.: WO2010/061662
PCT Pub. Date: Jun. 3, 2010

(65) Prior Publication Data
US 2011/0234964 A1 Sep. 29, 2011

(30) Foreign Application Priority Data
Nov. 26, 2008 (JP) ................................ 2008-301159

(51) Int. Cl.
*G02F 1/1345* (2006.01)
(52) U.S. Cl.
USPC ............ 349/152; 348/149; 348/150; 348/151
(58) Field of Classification Search
CPC .................. G02F 1/13452; G09G 2300/0408; H05K 3/323
USPC ................................ 349/149–152, 40, 153
See application file for complete search history.

(56) References Cited

U.S. PATENT DOCUMENTS

| 5,835,177 A | 11/1998 | Dohjo et al. |
| 6,275,278 B1 | 8/2001 | Ono et al. |

(Continued)

FOREIGN PATENT DOCUMENTS

| EP | 2 360 661 A | 8/2011 |
| JP | 5-019282 | 1/1993 |

(Continued)

OTHER PUBLICATIONS

International Search Report for PCT/JP2009/062061, mailed Sep. 8, 2009.

(Continued)

*Primary Examiner* — Lucy Chien
*Assistant Examiner* — Paisley L Arendt
(74) *Attorney, Agent, or Firm* — Nixon & Vanderhye P.C.

(57) ABSTRACT

Provided is a display device in which a frame can be made narrower while preventing connection faults. The present invention is a display device, provided with a display device substrate having an external connection terminal and a lower-layer wiring running below the external connection terminal, an external connection component, and a conductive member that electrically connects the display device substrate and the external connection component. The external connection component has a connection portion connected to the external connection terminal via the conductive member; the display device substrate further has an interlayer dielectric formed at a layer below the external connection terminal, and a wiring connection portion that is formed at a layer below the interlayer dielectric and that is connected to the external connection terminal by way of a first connection hole in the interlayer dielectric; and the first connection hole is disposed outside a region at which the connection portion and the conductive member overlap each other, in a plan view of the display device substrate.

17 Claims, 22 Drawing Sheets

(56) References Cited

U.S. PATENT DOCUMENTS

| | | | |
|---|---|---|---|
| 6,734,940 B2* | 5/2004 | Hirabayashi | 349/149 |
| 7,391,493 B2* | 6/2008 | Kim | 349/155 |
| 7,443,478 B2* | 10/2008 | Hirakata et al. | 349/149 |
| 7,868,989 B2* | 1/2011 | Yokota | 349/152 |
| 2002/0071086 A1 | 6/2002 | Kim et al. | |
| 2004/0085504 A1 | 5/2004 | Kim et al. | |
| 2004/0165120 A1 | 8/2004 | Woo et al. | |
| 2004/0232418 A1 | 11/2004 | Koyama et al. | |
| 2006/0119778 A1 | 6/2006 | Oda et al. | |
| 2006/0238450 A1 | 10/2006 | Onodera | |
| 2007/0296674 A1* | 12/2007 | Aoki et al. | 345/94 |
| 2008/0173900 A1 | 7/2008 | Yoon et al. | |
| 2011/0199738 A1 | 8/2011 | Moriwaki | |
| 2011/0205716 A1 | 8/2011 | Moriwaki | |

FOREIGN PATENT DOCUMENTS

| | | |
|---|---|---|
| JP | 10-161149 | 6/1998 |
| JP | 10-282522 | 10/1998 |
| JP | 11-24094 | 1/1999 |
| JP | 2002-202522 | 7/2002 |
| JP | 2002-258768 | 9/2002 |
| JP | 2004-347822 | 12/2004 |
| JP | 2006-146040 | 6/2006 |
| JP | 2006-215480 | 8/2006 |
| JP | 2006-309161 | 11/2006 |
| JP | 2008-58864 | 3/2008 |
| WO | WO 2010/058619 | 5/2010 |

OTHER PUBLICATIONS

Office Action issued in U.S. Appl. No. 12/998,380 dated Apr. 11, 2013.

Office Action issued in U.S. Appl. No. 12/998,380 dated Aug. 29, 2013.

Notice of Allowance issued in U.S. Appl. No. 12/998,380 dated Dec. 3, 2013.

* cited by examiner (a)

(b)

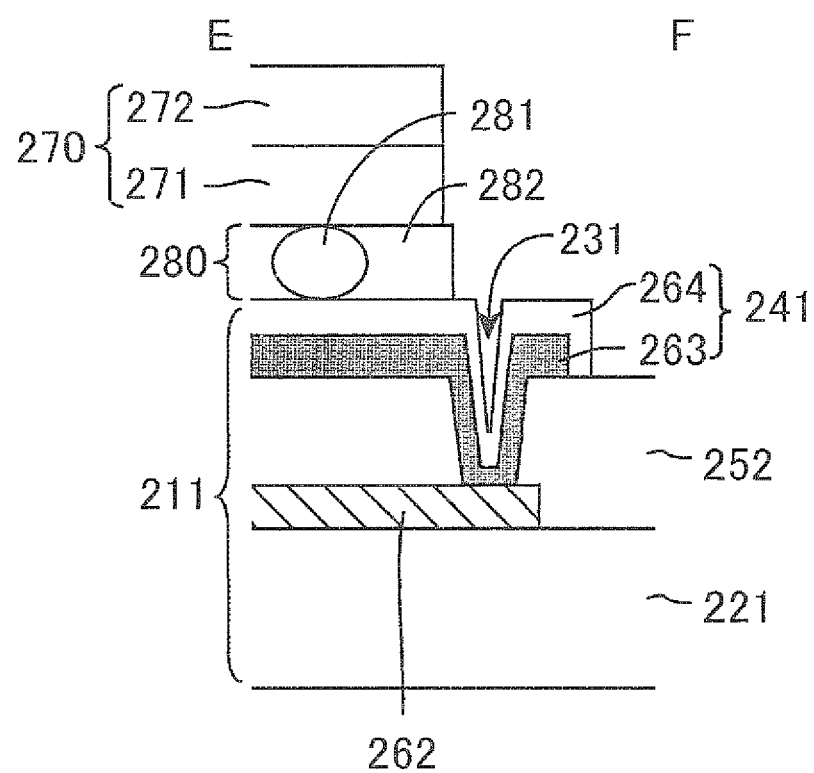

DISPLAY DEVICE HAVING HIGHER-LAYER WIRING THAT DOES NOT OVERLAP CONNECTION PORTION

This application is the U.S. national phase of International Application No. PCT/JP2009/062061, filed 1 Jul. 2009, which designated the U.S. and claims priority to 2008-301159, filed 26 Nov. 2008, the entire contents of each of which are hereby incorporated by reference.

TECHNICAL FIELD

The present invention relates to a display device. More particularly, the present invention relates to a display device that is suitable for a liquid crystal display device or an organic electroluminescent display device (organic EL display) having a display device substrate in which external connection terminals are provided for instance, for connection to a flexible printed circuit (FPC) board.

BACKGROUND ART

Electronic portable devices, such as mobile phones, PDAs and the like, in which such liquid crystal display devices and organic EL displays are installed, are required to be ever smaller and lighter. This has spurred developments directed at achieving a smaller periphery (frame region) of the display region, i.e. achieving a narrower frame.

Examples of conventional display devices include, for instance, a display device provided with common wirings that feed scanning line driving circuits that drive scanning lines, and common wirings that feed signal line driving circuits that drive signal lines; interlayer dielectrics that isolate respective common wirings; and a plurality of external connection terminals positioned above a plurality of respective contact holes that are provided in the interlayer dielectrics, in such a manner that part of each common wiring is exposed (for instance, Patent document 1).

[Patent Document 1]
Japanese Kokai Publication No. Hei-10-282522

DISCLOSURE OF THE INVENTION

However, attempting to achieve a narrower frame by relying on the technology disclosed in Patent document 1 resulted at times in connection faults between the display device substrate and an external connection component that is mounted, ordinarily by thermocompression bonding, onto the display device substrate.

In the light of the above, it is an object of the present invention to provide a display device that enables frame narrowing while preventing connection faults.

The inventors conducted varies studies on display devices in which frames could be made narrower while preventing connection faults, and came to focus on the likelihood of occurrence of connection faults, caused by crushing of an external connection terminal of the display device substrate by a conductive member that is used for electrically connecting the external connection terminal and a connection portion of the external connection component, during thermocompression bonding of the external connection component to the external connection terminal. The inventors found that causes underlying the crushing of external connection terminals included: (1) connection holes used for electric connection with wiring formed at a layer lower than the external connection terminal, in a region of an external connection terminal, are provided in the display device substrate in such a way so as run through an interlayer dielectric below the external connection terminal; (2) a conductive layer that makes up the external connection terminal is formed to a smaller thickness on the inner wall surface of the connection holes than at the top face of the interlayer dielectric; and (3) solder or an anisotropic conductive film containing conductive beads (conductive particles) is used as the conductive member. The inventors found that connection faults were likely to occur upon thermocompression bonding of an external connection component in the vicinity of a region at which such connection holes are disposed.

Upon further study, the inventors found that arranging connection holes outside the region at which a conductive member and a connection portion of a external connection component overlap each other has the effect of allowing restricting the pressure that is exerted by the conductive member onto the region at which the connection holes are disposed, upon thermocompression bonding of the external connection component onto the external connection terminal of the display device substrate by way of the conductive member, and has the effect of allowing effectively suppressing crushing of the external connection terminal. The inventors arrived at the present invention upon envisaging that the above findings could allow solving the above-described problems.

Specifically, the present invention is a display device (hereafter, also referred to as first display device of the present invention) provided with a display device substrate having an external connection terminal and a lower-layer wiring running below the external connection terminal, an external connection component, and a conductive member that electrically connects the display device substrate and the external connection component; wherein the external connection component has a connection portion connected to the external connection terminal via the conductive member; the display device substrate further has an interlayer dielectric formed at a layer below the external connection terminal, and a wiring connection portion that is formed at a layer below the interlayer dielectric and that is connected to the external connection terminal by way of a first connection hole in the interlayer dielectric; and the first connection hole is disposed outside a region at which the connection portion and the conductive member overlap each other, in a plan view of the display device substrate.

In the first display device of the present invention, the lower-layer wiring is provided below the external connection terminal, and hence the frame can be made narrower.

In the first display device of the present invention, the first connection hole is not present at a region at which the connection portion and the conductive member overlap each other and at which pressure is exerted during thermocompression bonding, and hence crushing of the conductive layer of the external connection terminal by the conductive member can be suppressed, even when the external connection component is thermocompression-bonded to the display device substrate. Thus, the first display device of the present invention enables frame narrowing while preventing connection faults.

In the present description, the terms "higher" or "above" denote a position farther from an insulating substrate (for instance, glass substrate, plastic substrate or silicon substrate) comprised in the display device substrate, and the terms "lower" or "below" denote a position closer to the insulating substrate. Accordingly, "higher layer" denotes a layer farther from the insulating substrate comprised in the display device substrate, and "lower layer" denotes a layer closer to the insulating substrate comprised in the display device substrate.

In the present description, a connection hole may be referred to also as a contact hole, through-hole, or via-hole.

The abovementioned connection portion is a connection terminal, for instance wiring, a bump or the like, that can be connected to the display device substrate.

The wiring connection portions are one part of the wiring, more specifically, are portions connected to (in contact with) conductive members such as other wiring, terminals or the like, and may be a part of the lower-layer wiring, or a part of wiring (for instance, routing wiring) other than the lower-layer wiring formed at a layer below the interlayer dielectric.

Provided that the above-described essential constituent elements are formed, the configuration of the first display device of the present invention is not particularly limited as regards the presence or absence of other constituent elements.

Preferred embodiments of the first display device of the present invention are explained in detail below. The below-described embodiments can be appropriately combined with each other.

The display device substrate may further have a higher-layer wiring that is electrically connected to the external connection terminal, via the wiring connection portion, such that the higher-layer wiring overlaps the external connection component, in a plan view of the display device substrate, and includes the same conductive layer as a conductive layer that makes up the external connection terminal; such that the higher-layer wiring is connected to the lower-layer wiring by way of a second connection hole in the interlayer dielectric; and the second connection hole may be disposed outside the region at which the connection portion and the conductive member overlap each other, in a plan view of the display device substrate. This allows enhancing the performance of the display device substrate while realizing a narrower frame.

In the present description, a configuration wherein a given member A overlaps a given member B may be a configuration wherein the entirety of member A overlaps member B, or a configuration wherein part of member A overlaps member B. The feature wherein the higher-layer wiring comprises the same conductive layer as a conductive layer that makes up the external connection terminal denotes a relationship whereby the conductive layer comprised in the external connection terminal and the conductive layer comprised in the corresponding higher-layer wiring have substantially the same composition, such that the conductive layer comprised in the higher-layer wiring can be formed simultaneously in the process of forming the conductive layer comprised in the external connection terminal. The conductive layer comprised in the external connection terminal and the conductive layer comprised in the higher-layer wiring may have dissimilar compositions, so long as the disparity therebetween does not preclude the conductive layers from being formed in one same step.

The display device substrate may further have an electrostatic discharge protection circuit connected to an electric path between the external connection terminal and the higher-layer wiring. This allows suppressing deterioration or destruction of the semiconductor element caused by electrostatic discharge and/or noise from the external connection component.

The display device substrate may further have a thin-film transistor in which a semiconductor layer, a gate insulator and a gate electrode are stacked in this order; such that the lower-layer wiring is electrically connected to the gate electrode. This allows suppressing, yet more effectively, deterioration or destruction of the semiconductor element caused by electrostatic discharge and/or noise from the external connection component.

The display device substrate may have a plurality of common wirings that includes the lower-layer wiring.

The higher-layer wiring may intersect the plurality of common wirings. As a result, the external connection terminal can be connected to an arbitrary common wiring below the external connection terminal.

At least two wirings from among the plurality of common wirings may be connected to an electric path between the external connection terminal and the higher-layer wiring. As a result, same-potential signals can be transmitted to common wirings.

The external connection terminal may be connected to the higher-layer wiring via two or more wiring layers. As a result, a layer at which there is arranged wiring that connects the higher-layer wiring and the external connection terminal can be modified in accordance with a layer at which there are disposed other intersecting wiring and/or elements. This affords a yet narrower frame and greater reliability.

The display device may further have a sealing material that seals a display element.

The first connection hole may be disposed between the sealing material and the region at which the connection portion and the conductive member overlap each other, in a plan view of the display device substrate. As a result, the connection hole can be disposed at a margin region between the sealing material and the conductive member. Enlargement of the frame section can thus be kept to a minimum, while suppressing connection faults.

The first connection hole may be disposed further toward an inner side of the display device substrate than the sealing material, in a plan view of the display device substrate. This allows enhancing the reliability of the contact portion of the external connection terminal.

The first connection hole may overlap the sealing material, in a plan view of the display device substrate. The frame can be made yet narrower thereby.

The display device substrate may further have a photo-spacer formed in the sealing material. This affords a further narrower frame and greater reliability, while suppressing faults such as connection faults.

The display device substrate may further have an insulating film formed below the sealing material. This affords a further narrower frame and greater reliability, while suppressing faults such as connection faults.

The insulating film may be disposed below substantially the entire sealing material. As a result, this allows suppressing loss of display quality in a liquid. crystal display device, derived from uneven cell thickness on account of level differences within the insulating film.

The conductive member may include conductive particles. When using an anisotropic conductive film, in particular, a conductive layer of the external connection terminal was likely to become cut, in the form of a ring, by the conductive particles in the anisotropic conductive film. This was likely to result in connection faults. The first display device of the present invention allows suppressing the occurrence of faults such as connection faults, in a particularly effective manner, in a case where conductive particles are present.

The above display device substrate, may have a plurality of the first connection holes, the external connection terminals, the wiring connection portions and the lower-layer wirings, such that, in a plan view of the display device substrate, the plurality of lower-layer wirings run alongside each other, crossing the plurality of external connection terminals, and are bent towards a same side with respect to the running direction (direction crossing the plurality of external connection terminals), in order from an outward lower-layer wiring;

and each of the plurality of wiring connection portions is a portion beyond a bent portion of any of the plurality of lower-layer wirings. In this configuration, the first connection holes are not disposed at a portion at which the lower-layer wirings cross the plurality of external connection terminals. The wiring spacing in the lower-layer wirings can be reduced. Therefore, this allows increasing the number of lower-layer wirings that can be disposed below the external connection terminals, and hence the frame can be made further narrower.

The feature wherein a plurality of lower-layer wirings run alongside each other does not require that the plurality of lower-layer wirings be closely juxtaposed parallelly to each other. Also, the feature wherein a plurality of lower-layer wirings are bent towards a same side does not require that the plurality of lower-layer wirings be bent in a same direction close to each other. For instance, the plurality of lower-layer wirings may be collectively bent towards either the inward side or the outer peripheral side of the display device substrate. The lower-layer wiring on the outward side may be lower-layer wiring positioned on the outer peripheral side of the display device substrate, or lower-layer wiring positioned on the inward side of the display device substrate.

The plurality of first connection holes may be provided collinearly in a plan view of the display device substrate. The frame can be made yet narrower thereby.

The present invention is also a display device (hereafter, also referred to as second display device of the present invention) provided with a display device substrate having an external connection terminal and lower-layer wiring running below the external connection terminal, a first external connection component, and a second external connection component, wherein the first external connection component and the second external connection component are connected to each other via the lower-layer wiring and are disposed, side by side, along the outer periphery of the display device substrate.

In the second display device of the present invention, the lower-layer wiring is provided below the external connection terminal, and the first external connection component and the second external connection component are disposed side by side along the outer periphery of the display device substrate. The frame can be made narrower as a result.

Provided that the above-described essential constituent elements are formed, the configuration of the second display device of the present invention is not particularly limited as regards the presence or absence of other constituent elements.

The second display device of the present invention may be appropriately combined with the first display device of the present invention and with various configurations thereof. As a result there can be obtained a further narrower frame, while preventing connection faults.

Effect Of The Invention

Thus, the first display device of the present invention enables frame narrowing while preventing connection faults, and the second display device of the present invention enables frame narrowing.

BRIEF DESCRIPTION OF THE DRAWINGS

FIG. 2 is a cross-sectional schematic diagram illustrating the configuration of the frame section of the liquid crystal display device in Embodiment 1, wherein FIG. 2(a) is a cross-sectional diagram along line A-B in FIG. 1, and FIG. 2(b) is a cross-sectional diagram along line C-D in FIG. 1;

FIG. 3-1 is a plan-view schematic diagram illustrating the configuration of a frame section in a liquid crystal display device of Embodiment 2;

FIG. 3-2 is a cross-sectional schematic diagram, along line E-F in FIG. 3-1, illustrating the configuration of the frame section in the liquid crystal display device in Embodiment 2;

FIG. 5-1 is a plan-view schematic diagram illustrating a variation of the configuration of the frame section in the liquid crystal display device of Embodiment 2;

FIG. 5-2 is a cross-sectional schematic diagram, along line G-H in FIG. 5-1, illustrating the variation of the configuration of the frame section in the liquid crystal display device of Embodiment 2;

FIG. 6-1 is a plan-view schematic diagram illustrating a variation of the configuration of the frame section in the liquid crystal display device of Embodiment 2;

FIG. 6-2 is a cross-sectional schematic diagram, along line I-J in FIG. 6-1, illustrating the variation of the configuration of the frame section in the liquid. crystal display device of Embodiment 2;

FIG. 7-1 is a plan-view schematic diagram illustrating a variation of the configuration of the frame section in the liquid crystal display device of Embodiment 2;

FIG. 7-2 is a cross-sectional schematic diagram, along line K-L in FIG. 7-1, illustrating the variation of the configuration of the frame section in the liquid crystal display device of Embodiment 2;

FIG. 8-1 is a cross-sectional schematic diagram illustrating a variation of the configuration of the frame section in the liquid crystal display device of Embodiment 2;

FIG. 8-2 is a cross-sectional schematic diagram, along line M-N in FIG. 8-1, illustrating the variation of the configuration of the frame section in the liquid crystal display device of Embodiment 2;

FIG. 13 is a cross-sectional schematic diagram illustrating the configuration of the frame section of the liquid crystal display device in Embodiment 3, wherein FIG. 13(a) is a cross-sectional diagram along line P-Q in FIG. 12, and FIG. 13(b) is a cross-sectional diagram along line R-S in FIG. 12;

FIG. 14-1 is a cross-sectional schematic diagram illustrating the configuration of a frame section in a liquid crystal display device in Comparative embodiment 1;

FIG. 14-2 is a cross-sectional schematic diagram, along line T-U in FIG. 14-1, illustrating the configuration of the frame section in the liquid crystal display device in Comparative embodiment 1;

MODE FOR CARRYING OUT THE INVENTION

The present invention will be explained in further detail below based on embodiments, with reference to accompanying drawings. However, the present invention is not limited to these embodiments.

(Embodiment 1)

Figure 1:
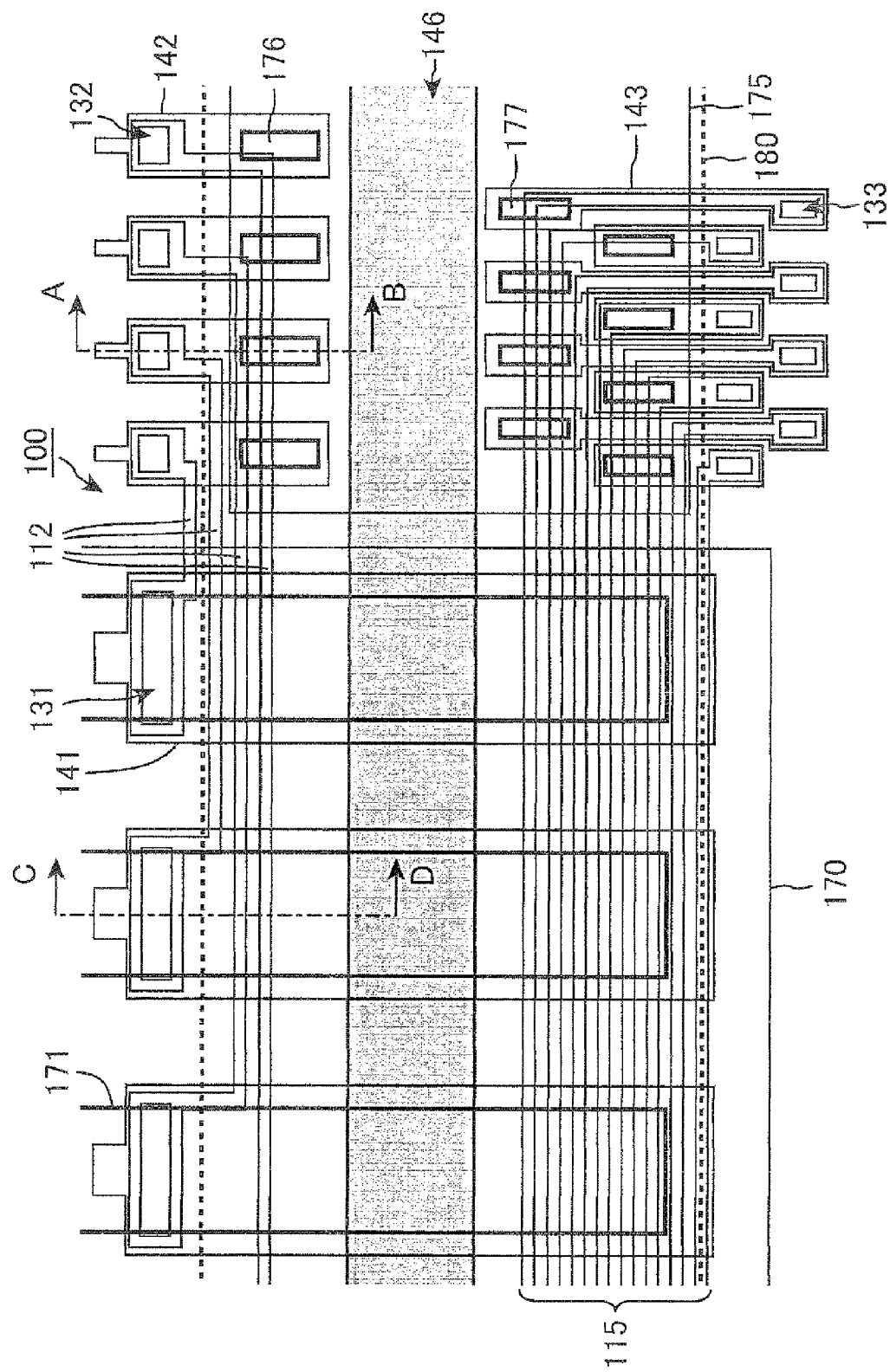
FIG. 1 is a plan-view schematic diagram illustrating the configuration of a frame section in a liquid crystal display device of Embodiment 1.
Figure 2:
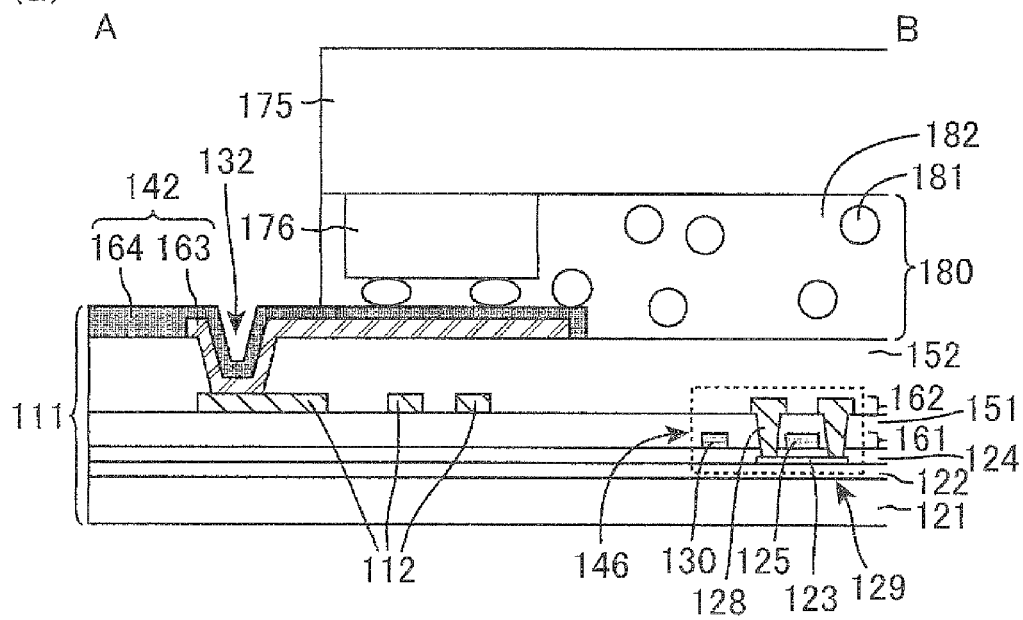
Figure 2:
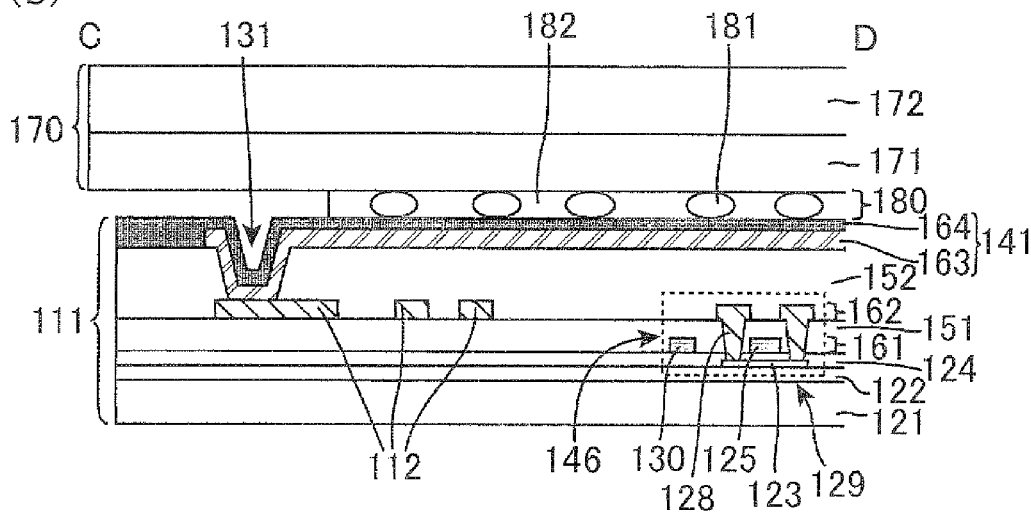

FIG. 1 is a plan-view schematic diagram illustrating the configuration of a frame section (outer peripheral section outside a display region) of a liquid crystal display device of Embodiment 1. FIG. 2 is a cross-sectional schematic diagram illustrating the configuration of the frame section of the liquid crystal display device in Embodiment 1, wherein FIG. 2(a) is a cross-sectional diagram along line A-B in FIG. 1, and FIG. 2(b) is a cross-sectional diagram along line C-D in FIG. 1.

As illustrated in FIG. 1 and FIG. 2, a liquid crystal display device 100 of the present embodiment has a structure wherein a thin-film transistor (TFT) substrate 111, being a display device substrate, are connected to an FPC (Flexible Printed Circuit) 170 being an external connection component, and an IC chip 175 being an external connection component by way of an ACF (anisotropic conductive film) 180, at a frame section of the liquid crystal display device. The FPC 170 and the IC chip 175 are juxtaposed along one side of the TFT substrate 111 that has a rectangular shape in a plan view. In the present embodiment and in other embodiments described below, the FPC 170 may comprise a flexible base material alone, or may be a rigid-FPC wherein a flexible base material is imparted with a hard (rigid) member. The example explained below, however, will deal with a rigid-FPC. The flexible base material portion, comprising polyimide or the like, is called a FPC, the mounting portion of electronic components such as various kinds of chips that make up, for instance, a liquid crystal controller, as well as resistors, capacitors and the like, is called a "rigid", and the combined whole of base material portion plus rigid is called a rigid-FPC.

Besides the TFT substrate 111, the liquid crystal display device 100 has a CF substrate disposed opposite the TFT substrate 111. The CF substrate comprises an insulating substrate, and sequentially stacked thereon, from the side of the insulating substrate: (1) a black matrix comprising a light-shielding member, and a red, green and blue color filter; (2) an overcoat layer; (3) a common electrode comprising a transparent conductive film; and (4) an alignment film. The outer peripheral section of the CF substrate and the TFT substrate 111 is sealed by a sealing material provided in the form of a frame. A liquid crystal material is filled in between the TFT substrate 111 and the CF substrate. The rigid-FPC 170 and the IC chip 175 are disposed on the TFT substrate 111, outward of the region at which the TFT substrate 111 and the CF substrate oppose each other.

The rigid-FPC 170 has formed thereon a plurality of wirings 171 juxtaposed parallelly to each other on a base material 172. These wirings 171 function as connection terminals (connection portions) of the rigid-FPC 170. Electronic components such as various kinds of chips that make up a liquid crystal controller or the like, as well as resistors, capacitors and the like, are mounted on the rigid-FPC 170.

The IC chip 175 has signal input bumps 176 and signal output bumps 177. The bumps 176, 177 function as connection terminals (connection portions) of the IC chip 175. The IC chip 175 is mounted, as a bare chip, on the TFT substrate 111, according to a COG (Chip on Glass) technique. Ordinarily, a source driver, a gate driver, a power supply circuit, a sensor circuit and so forth are built onto the IC chip 175. However, the circuits to be built onto the IC chip 175 are decided depending on the performance of the TFT that is built onto the TFT substrate 111. Specifically, the performance of the TFTs that are built onto the TFT substrate 111 vary depending on whether the material of the TFT is LPS (low-temperature polysilicon), CGS (continuous grain silicon) or amorphous silicon. The circuits built onto the IC chip 175 and the TFT substrate 111 are decided taking into account, for instance, the circuit operational capabilities that depend on the TFTs that are built onto the TFT substrate 111, avoidance of increases in circuit magnitude, and avoidance of drops in yield. The signal input bumps 176 are juxtaposed, while the signal output bumps 177 are disposed in a staggered fashion, i.e. are disposed alternately in two rows. Needless to say, the IC chip 175 may be an LSI chip.

On the TFT substrate 111 there are formed: a plurality of external connection terminals 141 juxtaposed parallelly to each other along one row, for respective wirings 171 of the rigid-FPC 170; a plurality of external connection terminals 142 juxtaposed parallelly to each other along one row, for respective signal input bumps 176; and a plurality of external connection terminals 143 disposed in the form of strips, for respective signal output bumps 177.

An ACF 180 is provided. so as to cover the external connection terminals 141, 142, 143. The external connection terminals 141 are connected to the wirings 171 of the rigid-FPC 170 by way of conductive beads (conductive particles) 181 that are a conductive member in the ACF 180. The external connection terminals 142 are connected to the signal input bumps 176 by way of the conductive beads 121, and the external connection terminals 143 are connected to the signal output bumps 177 by way of the conductive beads 181, The external connection terminals 141 are connected to wiring connection portions positioned at one of the end portions of wirings 112, which are lower-layer wirings formed at a layer below the interlayer dielectric 152 that is formed at a layer below the external connection terminals 141, by way of contact holes 131 that are provided in an interlayer dielectric 152. The wiring connection portions are one part of the wiring, more specifically, are portions connected to (in contact with) conductive members such as other wiring, terminals or the like. The wirings 112 extend from below the external connection terminals 141 up to below the external connection terminals 142. The wiring connection portions positioned at the other end portion of the wirings 112 is connected to the external connection terminals 142 by way of contact holes 132 provided in the interlayer dielectric 152. The rigid-FPC 170 supplies thereby power and signals to the TC chip 175.

The contact holes 131 are provided collinearly (along a line parallel to the extension direction of the wirings 112) for the end portions of the external connection terminals 141 that are positioned on the outer peripheral side of the TFT substrate 111. The contact holes 131 are disposed overlapping the wirings 171 of the rigid-FPC 170, but are disposed outside the region at which the wirings 171 and the ACF 180 overlap each other, i.e. are positioned so as not to overlap the ACF 180. Therefore, the external connection terminals 141 are each connected to any of the wirings 112 outside the region at which the wirings 171 and the ACF 180 overlap each other. That is, the external connection terminals 141 are separately provided at a portion connected to the wirings 171 of the rigid-FPC 170 (portion in contact with the conductive beads 181), and a portion connected to the wirings 112 (portion in contact with the wiring connection portions of the wirings 112). The portions connected to the wirings 112 are disposed so as not to overlap either the ACF 180 of the wirings 171 of the rigid-FPC 170.

The contact holes 132 are provided collinearly (along a line parallel to the extension direction of the wirings 112) for the end portions of the external connection terminals 142 that are positioned on the outer peripheral side of the TFT substrate 111. The contact holes 132 are positioned so as not to overlap either the signal input bumps 176 or the ACF 180. Therefore, the external connection terminals 142 are each connected to any of the wirings 112 outside the region at which the signal input bumps 176 and the ACF 180 overlap each other. That is, the external connection terminals 142 are separately provided at a portion connected to the signal input bumps 176 (portion in contact with the conductive beads 181), and a portion connected to the wirings 112 (portion in contact with the wiring connection portions of the wirings 112). The portions connected to the wirings 112 are disposed so as not to overlap either the ACF 180 or the signal input bumps 176.

The external connection terminals 141 and the external connection terminals 142 are arrayed along the arrangement region of the ACF 180. The wirings 112 are mainly juxtaposed along the array direction of the external connection terminals 141, 142, below the external connection terminals 141, 142. In the vicinity of one end portion, the wirings 112 are sequentially bent towards one same side (direction on the outer peripheral side of the TFT substrate 111 and perpendicular to the extension direction of the wirings 112), in the order from the wiring on the outer peripheral side of the TFT substrate 111. Wiring connection portions for contact with the external connection terminals 141 are provided at portions beyond the bent portions of the wirings 112. In the vicinity of the other end portion, the wirings 112 are sequentially bent towards one same side (direction on the outer peripheral side of the TFT substrate 111 and perpendicular to the extension direction of the wirings 112), in the order from the wiring on the outer peripheral side of the TFT substrate 111. Wiring connection portions for contact with the external connection terminals 142 are provided at portions beyond the bent portions of the wirings 112. Thus, the wirings 112 are shaped, in a plan view, as a square U.

The external connection terminals 143 are connected to wiring connection portions positioned at one of the end portions of common wirings 115, which are lower-layer wirings formed at a layer below the interlayer dielectric 152, by way of contact holes 133 that are provided in the interlayer dielectric 152. The common wirings 115 extend from below the external connection terminals 143 and pass below the external connection terminals 141, and are connected to elements built onto the TFT substrate 111, for instance semiconductor elements, resistors and capacitors. The above-mentioned semiconductor elements are ordinarily transistors, more specifically, TFTs. Each of the common wirings 115 is connected to two or more elements, for instance semiconductor elements, capacitors and resistors, and supply shared signals and power. As a result, the output signals and output power supply generated in the IC chip 175 are supplied to the various elements, for instance semiconductor elements, capacitors and resistors, that are built onto the TFT substrate 111.

The contact holes 133 are provided in a staggered fashion for the end portions of the external connection terminals 143 that are positioned on the inward side of the TFT substrate 111. The contact holes 133 are positioned so as not to overlap either the signal input bumps 177 or the ACF 180. Therefore, the external connection terminals 143 are each connected to any of the common wirings 115 outside the region at which the signal output bumps 177 and the ACF 180 overlap each other. That is, the external connection terminals 143 are separately provided at a portion connected to the signal input bumps 177 (portion in contact with the conductive beads 181), and a portion connected to the common wirings 115 (portion in contact with the wiring connection portions of the common wirings 115). The portions connected to the common wirings 115 are disposed so as not to overlap either the ACF 180 or the signal input bumps 177.

The external connection terminals 141 and the external connection terminals 143 are arrayed along the arrangement region of the ACF 180. The common wirings 115 are mainly juxtaposed along the array direction of the external connection terminals 141, 143, below the external connection terminals 141, 143. In the vicinity of one end portion, the common wirings 115 are sequentially bent towards one same side (direction on the inward side of the TFT substrate 111 and perpendicular to the extension direction of the common wirings 115), in the order from the wiring on the inward side of the TFT substrate 111. Wiring connection portions for contact with the external connection terminals 143 are provided at portions beyond the bent portions of the common wirings 115. Thus, the common wirings 115 are shaped, in a plan view, as an L.

A circuit block 146 that comprises routing wiring 130 and TFTs 129 is directly built onto the region of the TFT substrate 111 that overlaps the rigid-FPC 170 and the region of the TFT substrate 111 that overlaps the IC chip 175. In the circuit block 146 there are formed circuits that are distinct from the source driver, gate driver, power supply circuit and so forth of the IC chip 175.

The cross-sectional structure of the liquid crystal display device 100 is explained in detail below.

As illustrated in FIG. 2(*a*) and FIG. 2(*b*), the TFT substrate 111 has a structure wherein, at the frame section, an insulating substrate 121 has sequentially stacked thereon, from the side of the insulating substrate 121, a base coat film 122, a semiconductor layer 123, a gate insulator 124, a first wiring layer 161, an interlayer dielectric 151, a second wiring layer 162, an interlayer dielectric 152, a third wiring layer 163, and a transparent conductive layer 164. The TFT 129 comprises the semiconductor layer 123, the gate insulator 124 and a gate electrode 125 comprising the first wiring layer 161. Source/drain wiring 128, comprising the second wiring layer 162, is connected to source/drain regions of the semiconductor layer 123, by way of contact holes that run through the interlayer dielectric 151 and the gate insulator 124.

The routing wiring 130 is formed by the first wiring layer 161. The wirings 112 and the common wirings 115 are formed by the second, wiring layer 162, and the external connection terminals 141, 142, 143 are formed using a stack of the third wiring layer 163 and the transparent conductive layer 164. The TFT substrate 111 and the rigid-FPC 170 as well as the TFT substrate 111 and the IC chip 175, are thermocompression-bonded via the ACF 180 and become thereby connected to each other by the conductive beads 181 comprised in the ACF 180, and at the same time, the TFT substrate 111 and the rigid-FPC 170, as well as the TFT substrate 111 and the IC chip 175, are fixed to each other by way of an adhesive component 182 that comprises a thermosetting resin or the like and that is comprised in the ACF 180.

During thermocompression bonding, pressure is exerted, by way of the conductive beads 181, onto the external connection terminals 141, 142, 143, onto the wirings 171 of the rigid-FPC 170, as well as onto the signal input bumps 176 and the signal output bumps 177 of the IC chip 175, that correspond to the external connection terminals 141, 142, 143. Therefore, the film thickness of the stack of the third wiring layer 163 and the transparent conductive layer 164 in the contact holes may become thinner than at other portions, in a case where the contact holes 131, 132, 133 are provided at a region at which pressure is exerted (i.e. at a region at which the wirings 171, the signal input bumps 176, and the signal output bumps 177 overlap with the conductive beads 181), so that the external connection terminals 141, 142, 143 may be crushed, and connection faults occur, at that region, during thermocompression bonding. When using a conductive member in the form of the conductive beads 181 comprised in the ACF 180, in particular, a concern arises in that the external connection terminals 141, 142, 143 may become cut in the form of a ring, and connection faults may occur frequently.

In the liquid crystal display device 100 by contrast, the contact holes 131, 132, 133 are disposed outside a region at which the wirings 171 of the rigid-FPC 170, the signal output bumps 177 and the signal input bumps 176 of the IC chip 175, and the conductive beads 181 overlap each other, in a plan view of the TFT substrate 111. During thermocompression bonding, therefore, the conductive beads 181 are brought into contact only with the comparatively thick portion at the top face of the external connection terminals 141, 142, 143. This allows preventing pressure from being exerted, via the conductive beads 181, onto the external connection terminals 141, 142, 143 at a portion thereof, having small film thickness, within the contact holes 131, 132, 133, during thermocompression bonding. As a result there can be suppressed the occurrence of connection faults between the TFT substrate 111 and the rigid-FPC 170, and between the TFT substrate 111 and the IC chip 175 due to crushing of the external connection terminals 141, 142, 143.

In the current state of the art in mass production technologies, the wiring width and wiring spacing (line and space) of wiring groups, such as the wirings 112 and the common wirings 115, can be made as fine as about 2 μm in microfabrication techniques that rely on dry etching. The limits to microfabrication in the case of photolithography using a photosensitive organic insulating film in the form of the interlayer dielectric 152 that is provided at a layer above the wiring group, is of about 4 μm. In order to form the contact holes 131, 132, 133 for connection to the external connection terminals 141, 142, 143, on the wiring group, it becomes therefore necessary to form the actual contact holes 131, 132, 133 to a wider width than that of the wiring group, in view of the position control precision of the contact holes 131, 132, 133 and in view of the microfabrication precision of the contact holes 131, 132, 133. Therefore, in a hypothetical case where the contact holes 131, 132, 133 are simply disposed on an extension portion of the wiring group, the distance between respective wirings increases, which is a concern, in that fewer wirings that can then be disposed below the external connection terminals 141, 142, 143.

In the liquid crystal display device 100, by contrast, the wirings 112 run alongside each other crossing the external connection terminals 141, 142, in a plan view of the TFT substrate 111, and are bent towards a same side with respect to the running direction, in order from the outward wiring, such that the contact holes 131 and the contact holes 132 are connected to portions beyond the bent portions of the wirings 112 (wiring connection portions). The common wirings 115 run alongside each other crossing the external connection terminals 141, 143, in a plan view of the TFT substrate 111, and are bent towards a same side with respect to the running direction, such that the contact holes 133 are connected to portions beyond the bent portions of the common wirings 115 (wiring connection portions). Thus, the line and space in wiring groups such as the wirings 112 and the common wirings 115 can be kept as small as possible by not arranging the contact holes 131, 132, 133 at extension portions of the wirings 112 and the common wirings 115, also in a case where a photosensitive organic insulating film is used as the interlayer dielectric 152. Line and space can likewise be kept as small as possible regardless of the number of the wirings in the wiring groups. Accordingly, there is no need for reducing the number of wirings that can be disposed below the external connection terminals 141, 142, 143, and hence the frame can be made narrower.

The contact holes 131, 132 are provided collinearly (more preferably, along a line parallel to the extension direction of the wirings 112), in a plan view of the TFT substrate 111. Therefore, this allows restricting the surface area of the entire region at which the contact holes 131, 132 are disposed, while securing the size of the respective contact holes 131, 132, to a greater extent than in the case where the contact holes 131, 132 are disposed in a broken fashion, for instance in a zigzag fashion. The frame can be made yet narrower thereby.

The plane-view shape of the contact holes 131, 132, 133 is not particularly limited. Also, the contact holes 131, 132, 133 may be divided each into a plurality of contact holes.

Figure 16:
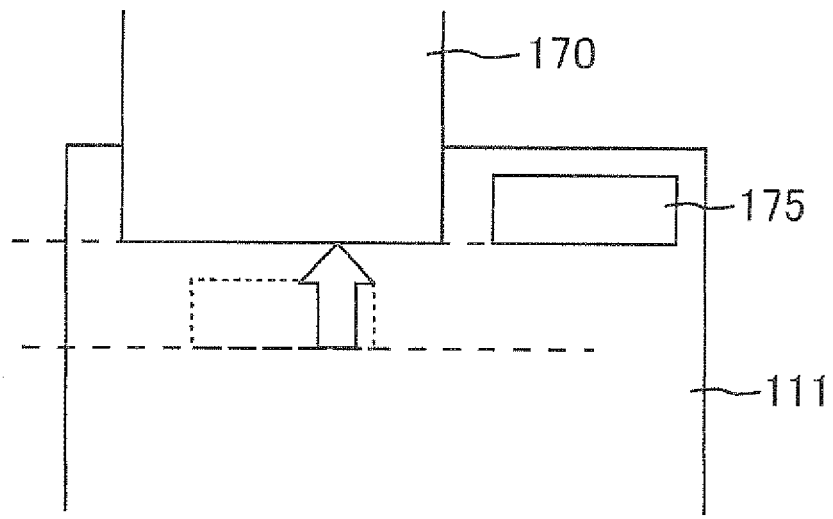
FIG. 16 is another plan-view schematic diagram illustrating the configuration of the frame section in the liquid crystal display device of Embodiment 1.
Figure 17:
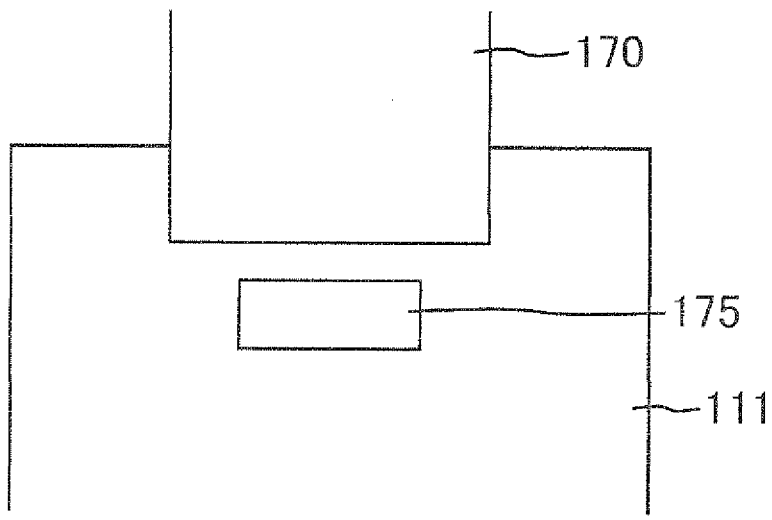
FIG. 17 is a plan-view schematic diagram illustrating the configuration of a frame section in a liquid crystal display device of a Comparative embodiment.

In the liquid crystal display device 100, the rigid-FPC 170 and the IC chip 175 are connected to each other by way of the wirings 112, as lower-layer wirings, and are disposed side by side along the outer periphery of the TFT substrate 111, as illustrated in FIG. 16. As a result, the frame can be narrower than in an instance where the rigid-FPC 170 and the IC chip 175 are sequentially disposed from the outer peripheral side of the TFT substrate 111, as in the Comparative embodiment illustrated in FIG. 17. In the liquid crystal display device 100, forming the wirings at a layer below the external connection terminals has the effect of rendering unnecessary routing wiring from the external connection terminals towards the inward side of the panel. This makes for a narrower frame, since the routing wirings can be drawn under the terminals. Conventional configurations required routing wirings to extend inwards of the panel, even when disposed side by side. This precluded achieving a frame-narrowing effect.

An example of a method for manufacturing the liquid crystal display device of Embodiment 1 is explained below.

As a pre-treatment, the insulating substrate 121 is firstly subjected to cleaning and pre-annealing. The insulating substrate 121 is not particularly limited, but is preferably, for instance, a glass substrate or resin substrate, from the viewpoint of costs, among others. Steps (1) to (15) below are carried out next.

(1) Base Coat Film Formation Step

On the insulating substrate 121 there is formed the base coat film 122 through sequential formation of a SiON film having a film thickness of 50 nm, and a SiOx film having a film thickness of 100 nm by plasma-enhanced chemical vapor deposition (PECVD). Examples of a starting material gas for forming the SiON film include, for instance, a mixed gas of monosilane (SiH$_4$), nitrous oxide gas (N$_2$O) and ammonia (NH$_3$). Preferably, the SiOx film is formed using tetraethyl orthosilicate (TEOS) gas as a starting material gas. The base coat film 122 may also comprise a silicon nitride (SiNx) film formed using, for instance, a mixed gas of monosilane (SiH$_4$) and ammonia (NH$_3$) as a starting material gas.

(2) Semiconductor Layer Formation Step

An amorphous silicon (a-Si) film having a film thickness of 50 nm is formed by PECVD. Examples of starting material gas for forming the a-Si film include, for instance, SiH$_4$, disilane (Si$_2$H$_6$) and the like. The a-Si film formed by PECVD comprises hydrogen, and hence a treatment for lowering the hydrogen concentration in the a-Si film is performed at about 500° C. (dehydrogenation treatment). Laser annealing is performed next, to from a polycrystalline silicon (polysilicon, p-Si) film through melting, cooling and crystallization of the a-Si film. Laser annealing is performed, for instance, using an excimer laser. To form. the p-Si film, a metallic catalyst, such as nickel or the like, may be applied to the a-Si film without performing a dehydrogenation treatment, followed by solid-phase growth through a thermal treatment (in order to form continuous-grain (CG) silicon), as a pre-treatment the laser annealing. To crystallize the a-Si film there may be performed solid-phase growth alone, by a thermal treatment. Next, dry etching is performed using a mixed gas of carbon tetrafluoride (CF$_4$) and oxygen (O$_2$), to pattern the p-Si film and form the semiconductor layer 123.

(3) Gate Insulator Formation Step

Next, the gate insulator 124 comprising silicon oxide and having a film thickness of 45 nm is formed using TEOS gas as a starting material gas. The material of the gate insulator 124 is not particularly limited, and there may be used, for instance, a SiNx film or a SiON film. The starting material gas for forming the SiNx film and the SiON film may be the same as the starting material gas in the base coat film formation step described above. The gate insulator 124 may be a stack comprising the above-mentioned plurality of materials.

(4) Ion Doping Step

An impurity such as boron or the like is doped into the semiconductor layer 123, by ion doping, ion implantation or the like, in order to control the threshold value of the TFT 129. More specifically, an impurity such as boron or the like is doped into a semiconductor layer that constitutes an N channel-type TFT or a P channel-type TFT (first doping step), and then an impurity such as boron is further doped into the semiconductor layer that constitutes the N channel-type, in a state where the semiconductor layer that constitutes the P channel-type TFT is masked with a resist (second doping step). The first doping step may be omitted if threshold value control of the P channel-type TFT is not necessary.

(5) First Wiring Layer Formation Step

Next, a tantalum nitride (TaN) film having a film thickness of 30 nm, and a tungsten (W) film having a film thickness of 370 nm are formed, in this order, by sputtering. Next, a resist mask is formed by patterning a resist film to a desired shape, by photolithography, after which the first wiring layer 161 is formed by dry etching using an etching gas in which there are adjusted the quantities of a mixed gas of, for instance, argon (Ar), sulfur hexafluoride (SF$_6$), carbon tetrafluoride (CF$_4$), oxygen (O$_2$), chlorine (Cl$_2$) and the like. As the material of the first wiring layer 161 there can be used a high-melting point metal having a planarized surface and stabilized characteristics, for instance tantalum (Ta), molybdenum (Mo), molybdenum tungsten (MoW) or the like, or a low-resistivity metal such as aluminum (Al) or the like. The first wiring layer 161 may be a stack comprising the above-described plurality of materials.

(6) Source/Drain Region Formation Step

Next, in order to form the source/drain regions of the TFT 129, the semiconductor layer 123 is doped, to a high concentration, with an impurity such as phosphorus or the like, for an N channel-type TFT, or an impurity such as boron or the like, for a P channel-type TFT, by ion doping or ion implantation, using the gate electrode 125 as a mask. An LDD (Lightly Doped Drain) region may also be formed in this case, as needed. Next, a thermal activation treatment is performed at about 700° C., for 6 hours, in order to activate the impurity ions in the semiconductor layer 123. The electric conductivity of the source/drain regions can be enhanced thereby. Examples of the activation method include, for instance, irradiation of an excimer laser.

(7) Interlayer Dielectric and Contact Hole Formation Step

Next, the interlayer dielectric 151 is formed by PECVD on the entire surface of the insulating substrate 121, through formation of a SiNx film having a film thickness of 100 to 400 nm (preferably, 200 to 300 nm), and a TEOS film having a film thickness of 500 to 1000 nm (preferably, 600 to 800 nm). A SiON film or the like may also be used as the interlayer dielectric 151. A thin cap film (for instance, a TEOS film) about 50 nm thick may be formed at a layer below the interlayer dielectric 151 in order to suppress impairment of TFT characteristics, caused by transient degradation, and in order to stabilize the electric characteristics of the TFT 129. Next, a resist mask is formed by patterning a resist film to a desired shape, by photolithography, after which contact holes are formed in the gate insulator 124 and the interlayer dielectric 151 by wet etching of the gate insulator 124 and the interlayer dielectric 151 using a hydrofluoric acid-based etching solution. Etching may be dry etching.

(8) Hydrogenation Step

Thereafter, a thermal treatment is performed at about 400° C., for 1 hour, in order to correct defects in crystalline Si of the semiconductor layer 123, through hydrogen supplied from the SiNx film of the interlayer dielectric 151

(9) Second Wiring Layer Formation Step

Next, a titanium (Ti) film having a film thickness of 100 nm, an aluminum (Al) film having a film thickness of 500 nm and a Ti film having a film thickness of 100 nm are formed, in this order, by sputtering or the like. Next, a resist mask is formed by patterning a resist film to a desired shape, by photolithography, after which the Ti/Al/Ti metal multilayer film is patterned by dry etching, to form the second wiring layer 162. An Al—Si alloy or the like may be used, instead of Al, as the metal that makes up the second wiring layer 162. Herein, Al is used for lowering wiring resistance, but the above-described materials of the first wiring layer 161 (Ta, Mo, MoW, W, TaN or the like) may be used as the metal that makes up the second wiring layer 162 in a case where high heat resistance is required and a certain increase in resistance values is allowable (for instance, in case of short wiring structures).

(10) Interlayer Dielectric and Contact Hole Formation Step

Next, the interlayer dielectric 152 is formed on the entire surface of the insulating substrate 121, through coating, by spin coating or the like, of a photosensitive resin, such as a photosensitive acrylic resin, to a film thickness of 1 to 5 μm (preferably, 2 to 3 μm). As the material of the interlayer dielectric 152 there can be used, for instance, non-photosensitive resins such as non-photosensitive acrylic resins, and photosensitive or non-photosensitive polyalkylsiloxane resins, polysilazane resins, polyimide resins and parellin resins. Other examples of materials of the interlayer dielectric 152 include methyl-containing polysiloxane (MSQ) materials and porous MSQ materials. If a photosensitive resin is used as the material of the interlayer dielectric 152, firstly a photosensitive resin film is exposed to light a via a photomask having formed therein a light-shielding pattern of desired shape, followed by etching (development), to remove thereby regions in the photosensitive resin film that yield the contact holes 131, 132, 133. The photosensitive resin film is subjected next to a baking step (for instance, at 200° C. for 30 minutes). Thereby, the shape of an opening (hole portion) of the interlayer dielectric 152 becomes less steep, and the aspect ratio of the contact holes 131, 132, 133 can be reduced. An ashing (stripping) step upon initial removal of the contact portion of the interlayer dielectric 152 (portion that yields the contact holes 131, 132, 133) becomes unnecessary. The interlayer dielectric 152 may be a stack comprising a plurality of materials.

(11) Third Wiring Layer Formation Step

Next, a titanium (Ti) film having a film thickness of 100 nm, an aluminum (Al) film having a film thickness of 500 nm and a Ti film having a film thickness of 100 nm are formed, in this order, by sputtering or the like. Next, a resist mask is formed by patterning a resist film to a desired shape, by photolithography, after which the Ti/Al/Ti metal multilayer film is patterned by dry etching, to form the third wiring layer 163. An Al—Si alloy or the like may be used, instead of Al, as the metal that makes up the third wiring layer 163. Herein, Al is used for lowering wiring resistance, but the above-described materials of the first wiring layer 161 (Ta, Mo, MoW, W, TaN or the like) may be used as the metal that makes up the third wiring layer 163 in a case where high heat resistance is required. and a certain increase in resistance values is allowable (for instance, in case of short wiring structures).

(12) Organic Insulating Film Formation Step

Next, an organic insulating film is formed at the display region of the TFT substrate 111, through coating, by spin coating or the like, of a photosensitive acrylic resin, to a film thickness of 1 to 3 μm (preferably, 2 to 3 μm). As the organic insulating film there can be used, for instance, non-photosensitive resin films such as non-photosensitive acrylic resin films, and films comprising photosensitive or non-photosensitive polyalkylsiloxane resins, polysilazane resins, polyimide resins and parellin resins. Other examples of materials of the organic insulating film include methyl-containing polysiloxane (MSQ) materials and porous MSQ materials. Herein, the organic insulating film is formed on the entire surface of the substrate 121, through coating, by spin coating or the like, of a photosensitive acrylic resin, for instance a naphthoquinone diazide-based UV-curable resin, having a film thickness of 1 to 5 μm (preferably, 2 to 3 μm). Next, the region of the contact holes in the organic insulating film is removed by exposing to light the organic insulating film via a photomask having formed therein a light-shielding pattern of desired shape, followed by etching (development). The organic insulating film is subjected next to a baking step (for instance, at 200° C. for 30 minutes). Thereby, the shape of the opening (hole portion) of the organic insulating film 51 becomes less steep, and the aspect ratio of the contact holes can be reduced. An asking (stripping) step upon initial removal of the contact portion of the organic insulating film (portion that yields the contact holes) becomes unnecessary.

(13) Transparent Conductive Layer Formation Step

Next, an ITO (indium tin oxide) film and/or an IZO (indium zinc oxide) film having a film thickness of 50 to 200 nm (preferably, 100 to 150 nm) is formed by sputtering or the like, and is then patterned to a desired shape by photolithography, to form the transparent conductive layer 164. Herein, pixel electrodes are formed in a matrix-like array that corresponds to respective pixels in the display region of the TFT substrate 111. Thereafter, an alignment film. is coated onto the display region, and the alignment film is subjected to an alignment treatment, to complete thereby the TFT substrate 111.

The external connection terminals 141, 142, 143 may be formed from a single transparent conductive layer 164. Preferably, however, the external connection terminals 141, 142, 143 are a stack that comprises the transparent conductive layer 164, as a topmost conductive layer, and the third wiring layer 163, as a conductive layer one layer below the topmost conductive layer, from the viewpoint of reducing the electrical resistance of the external connection terminals 141, 142, 143. In case that the external connection terminals 141, 142, 143 comprise the topmost conductive layer alone, then the topmost conductive layer is ordinarily a transparent conductive film, such as an ITO film, and the sheet resistance value is high. However, the sheet resistance value of the external connection terminals 141, 142, 143 can arguably be reduced by using a stack structure comprising a topmost conductive layer and a lower conductive layer having lower resistance. In a case of a stack structure that comprises a topmost conductive layer without a conductive layer one layer below but with a conductive layer two layers below (in the present embodiment, the second wiring layer 162), the surface of the conductive layer two layers below is damaged due to dry etching or the like. The contact resistance between the topmost wiring layer and the conductive layer two layers below may increase as a result, giving rise to greater terminal resistance. From the viewpoint of lowering the terminal resistance of the external connection terminals 141, 142, 143, therefore, the third wiring layer 163 (conductive layer one layer below the topmost conductive layer) is left to remain below the transparent conductive layer 164 (topmost conductive layer).

(14) Panel Assembly Step

Next, the liquid crystal display panel is manufactured by performing a bonding step of the TFT substrate 111 and the CF substrate, a liquid crystal material filling step, and a polarizer affixing step. The method for filling the liquid crystal material may be, for instance, a one drop filling method or a vacuum injection method. The vacuum injection method involves providing a liquid crystal filling port in part of the sealing material that is used for bonding the TFT substrate 111 and the CF substrate, and filling the liquid crystal material through the port, followed by sealing of the liquid crystal filling port using a UV-curable resin or the like.

The liquid crystal mode of the liquid crystal display panel is not particularly limited, and may be, for instance, a TN (Twisted Nematic) mode, an IPS (In Plane Switching) mode, a VA (Vertical Alignment) mode, a VATN (Vertical Alignment Twisted Nematic) mode, or a PSA (Polymer Sustained Alignment) mode. The liquid crystal display panel may be of domain-division type, wherein a plurality of domains is formed in each pixel. The liquid crystal display panel may be of transmissive-type, of reflective type, or of semitransmissive-type (reflective/transmissive type). The liquid crystal display panel may be modified to a type driven by passive matrix driving.

(15) Rigid FPC and IC Chip Affixing Step

Next, the TFT substrate 111 and the rigid-FPC 170, as well as the TFT substrate 111 and the IC chip 175, are thermocompression-bonded, by way of the ACF (anisotropic conductive film) 180 in which an adhesive component 182 (for instance, a thermosetting resin such as a thermosetting epoxy resin) has conductive beads 181 dispersed therein.

Thereafter, the liquid crystal display panel and a backlight unit are combined together, to complete thereby the liquid crystal display device 100 of the present embodiment.

(Embodiment 2)

Figures 1, 3:
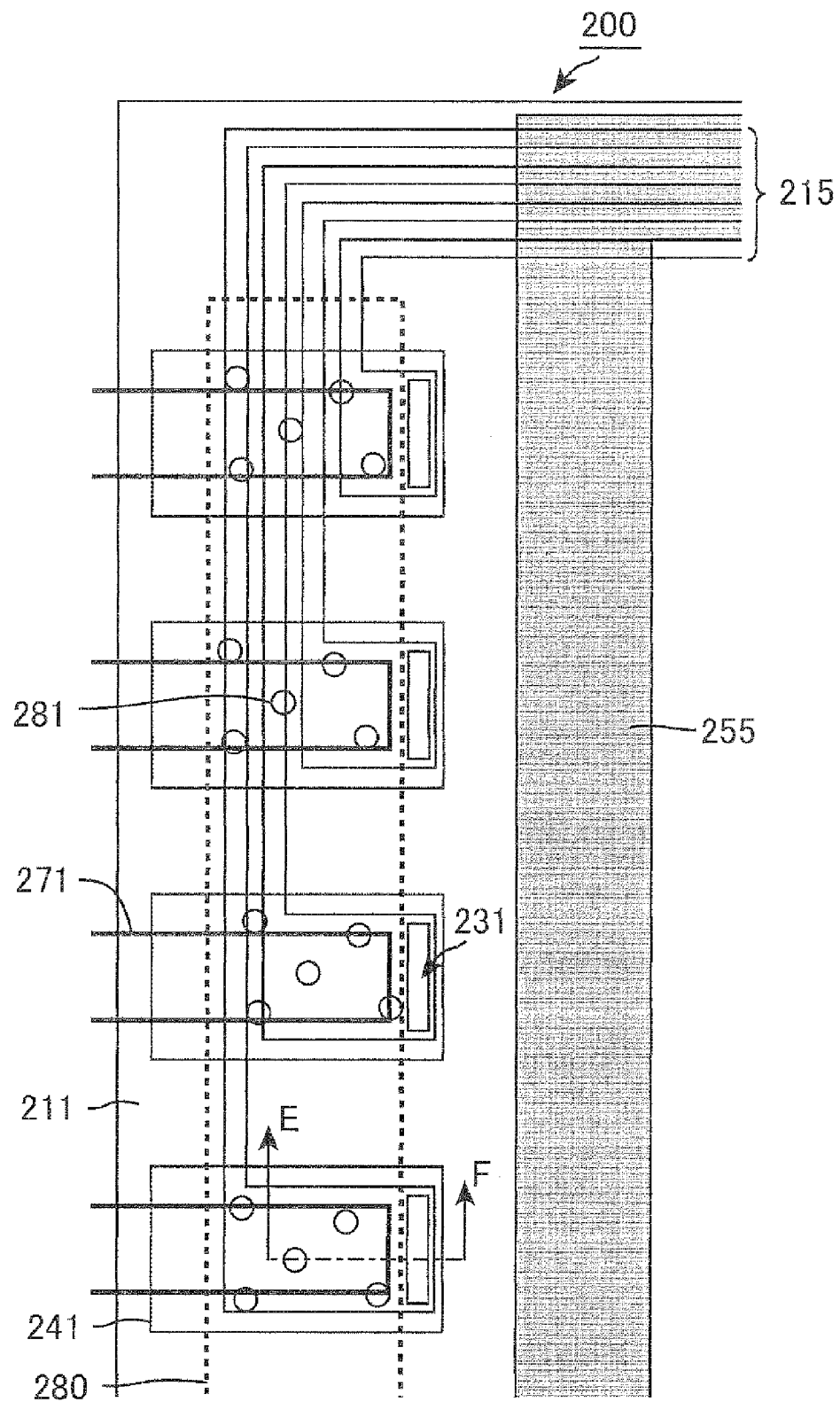

FIG. 3-1 is a plan-view schematic diagram illustrating the configuration of a frame section (outer peripheral section outside a display region) of a liquid crystal display device of Embodiment 2. FIG. 3-2 is a cross-sectional schematic diagram, along line E-F in FIG. 3-1, illustrating the configuration of the frame section of the liquid crystal display device in Embodiment 2.

As illustrated in FIG. 3-1 and FIG. 3-2, a liquid crystal display device 200 of the present embodiment has a structure in which a TFT substrate 211, being a display device substrate, and a rigid-FPC 270, being an external connection component, are connected to each other, at a frame section, by way of an ACF 280.

Besides the TFT substrate 211, the liquid crystal display device 200 has a CF substrate disposed opposite the TFT substrate 211. The CF substrate comprises an insulating substrate, and sequentially stacked thereon, from the side of the insulating substrate: (1) a black matrix comprising a light-shielding member, and a red, green and blue color filter; (2) an overcoat layer; (3) a common electrode comprising a transparent conductive film; and (4) an alignment film. The outer peripheral section of the CF substrate and the TFT substrate 211 is sealed by a sealing material 255 provided in the form of a frame. A liquid crystal material is filled in between the TFT substrate 211 and the CF substrate. The rigid-FPC 270 is disposed on the TFT substrate 211, outward of the region at which the TFT substrate 211 and the CF substrate oppose each other.

The rigid-FPC 270 has formed thereon a plurality of wirings 271 juxtaposed parallelly to each other on a base material 272. These wirings 271 function as connection terminals (connection portions) of the rigid-FPC 270. Electronic components such as various kinds of chips that make up a liquid crystal controller, a power supply IC or the like, as well as resistors, capacitors and the like, are mounted on the rigid-FPC 270.

On the TFT substrate 211 there are formed external connection terminals 241, corresponding to the wirings 271 of the rigid-FPC 270, juxtaposed parallelly to each other in a row.

An ACF 280 is provided so as to cover the external connection terminals 241. The external connection terminals 241 are connected to the wirings 271 of the rigid-FPC 270 by way of conductive beads (conductive particles) 281 that are a conductive member in the ACF 280.

The external connection terminals 241 are connected to wiring connection portions positioned at one of the end portions of common wirings 215, which are lower-layer wirings formed at a layer below the interlayer dielectric 252 that is formed at a layer below the external connection terminals 241, by way of contact holes 231 that are provided in the interlayer dielectric 252. The common wirings 215 extend, along the outer periphery of the TFT substrate 211, from below the external connection terminals 241 towards another portion of the frame section of the TFT substrate 211 at which there are no external connection terminals 241. The common wirings 215 are connected to elements built onto the TFT substrate 211, for instance semiconductor elements, capacitors and resistors. The above-mentioned semiconductor elements are ordinarily transistors, more specifically, TFTs. Each of the common wirings 215 is connected to two or more elements, for instance semiconductor elements, capacitors and resistors, and supply shared signals and power. As a result, signals and power are supplied, from the rigid-FPC 270, to the elements built onto the TFT substrate 211, for instance semiconductor elements, capacitors and resistors.

The contact holes 231 are provided collinearly (along a line parallel to the extension direction of the wirings 215) for the end portions of the external connection terminals 241 that are positioned on the inward side of the TFT substrate 211. The contact holes 231 are disposed outside the region at which the wirings 271 and the ACF 280 overlap each other, i.e. are positioned so as not to overlap either the ACF 280 or the wirings 271 of the rigid-FPC. Therefore, the external connection terminals 241 are each connected to any of the common wirings 215 outside the region at which the wirings 271 and the ACF 280 overlap each other. That is, the external connection terminals 241 are separately provided at a portion connected to the wirings 271 of the rigid-FPC 270 (portion in contact with the conductive beads 281), and a portion connected to the common wirings 215 (portion in contact with the wiring connection portions of the common wirings 215). The portions connected to the common wirings 215 are disposed so as not to overlap either the ACF 280 or the wirings 271 of the rigid-FPC 270.

The contact holes 231 are provided between the ACF 280 and the sealing material 255, more specifically, between the sealing material 255 and a region at which the ACF 280 and the wirings 271 of the rigid-FPC 270 overlap each other.

The external connection terminals 241 are arrayed along the arrangement region of the ACF 180. The common wirings 215 are mainly juxtaposed along the array direction of the external connection terminals 241, below the external connection terminals 241. In the vicinity of one end portion, the common wirings 215 are sequentially bent towards one same side (direction on the inward side of the TFT substrate 211 and perpendicular to the extension direction of the common wirings 215, i.e. rightwards direction in FIG. 3-1), in the order from the wiring on the inward side of the TFT substrate 211. Wiring connection portions for contact with the external connection terminals 241 are provided at portions beyond the bent portions of the common wirings 215. In the vicinity of the end portion, thus, the common wirings 215 are shaped, in a plan view, as an L.

The cross-sectional structure of the liquid crystal display device 200 is explained in detail below.

As illustrated in FIG. 3-2, the TFT substrate 211 has a structure wherein, at a frame section, a second wiring layer 262, an interlayer dielectric 252, a third wiring layer 263, and a transparent conductive layer 264 are stacked above an insulating substrate 221, in this order from the side of the insulating substrate 221. At layers below the second wiring layer 262 there are stacked a base coat film, a semiconductor layer, a gate insulator, a first wiring layer and an interlayer dielectric in this order, as in Embodiment 1.

The common wirings 215 are formed by the second wiring layer 262, and the external connection terminals 241 are formed by a stack of the third wiring layer 263 and the transparent conductive layer 264. The TFT substrate 211 and the rigid-FPC 270 are thermocompression-bonded via the ACF 280 and become thereby connected to each other by the conductive beads 281 comprised in the ACF 280, and the TFT substrate 211 and the rigid-FPC 270 are fixed to each other by way of an adhesive component 282 that comprises a thermosetting resin or the like and that is comprised in the ACF 280.

During thermocompression bonding, pressure is exerted, by way of the conductive beads 281, onto the external connection terminals 241 and the corresponding wirings 271 of the rigid-FPC 270270. Therefore, in a hypothetical case where the contact holes 231 are provided at a region at which this pressure is exerted (region at which the wirings 271 and the conductive beads 281 overlap each other), the pressure is then exerted also onto the external connection terminals 241 at a portion thereof positioned within the contact holes 231 and that is ordinarily a portion of small film thickness. As a result, the external connection terminals 241 at that portion may be crushed, and connection faults may occur at that portion, during thermocompression bonding. When using a conductive member in the form of the conductive beads 281 comprised in the ACF 280, in particular, a concern arises in that the external connection terminals 241 may become cut in the form of a ring, and connection faults may occur frequently.

In the liquid crystal display device 200, by contrast, the contact holes 231 are disposed outside the region at which the conductive beads 281 and the wirings 271 of the rigid-FPC 270 overlap each other, in a plan view of the TFT substrate 211. During thermocompression bonding, therefore, the conductive beads 281 are brought into contact only with the comparatively thick portion at the top face of the external connection terminals 241. This allows preventing pressure from being exerted, via the conductive beads 281, onto the external connection terminals 241 at a portion thereof, having small film thickness, within the contact holes 231, during thermocompression bonding. As a result there can be suppressed the occurrence of connection faults between the TFT substrate 211 and the rigid-FPC 270 due to crushing of the external connection terminals 241.

In the current state of the art in mass production technologies, the wiring width and wiring spacing (line and space) of wiring groups, such as the common wirings 215, can be made as fine as about 2 μm in microfabrication techniques that rely on dry etching. The limits to microfabrication in the case of photolithography using a photosensitive organic insulating film in the form of the interlayer dielectric 252 that is provided at a layer above the wiring group, is of about 4 μm. In order to form the contact holes 231 for connection to the external connection terminals 241, on the wiring group, it becomes therefore necessary to form the actual contact holes 231 to a wider width than that of the wiring group, in view of the position control precision of the contact holes 231 and in view of the microfabrication precision of the contact holes 231. Therefore, in a hypothetical case where the contact holes 231 are simply disposed on an extension portion of the wiring group, the distance between respective wirings increases, which is a concern in that this reduces the number of wirings that can be disposed below the external connection terminals 231.

In the liquid crystal display device 200, by contrast, the common. wirings 215 run alongside each other crossing the external connection terminals 241, in a plan view of the TFT substrate 211, and are bent towards a same side with respect to the running direction, in order from the outward wiring, such that the contact holes 231 are connected to portions beyond the bent portions of the common wirings 215 (wiring connection portions). Thus, line and space in the common wirings 215 can be kept as small as possible by not arranging the contact holes 231 over extension portions of the common wirings 215, also in a case where a photosensitive organic insulating film is used as the interlayer dielectric 252. Line and space can likewise be kept as small as possible regardless of the number of common wirings 215. Accordingly, there is no need for reducing the number of wirings that can be disposed below the external connection terminals 241, and hence the frame can be made narrower.

The contact holes 231 are provided collinearly (more preferably, along a line parallel to the extension direction of the common wirings 215), in a plan view of the TFT substrate 211. Therefore, this allows restricting the surface area of the entire region at which the contact holes 231 are disposed, while securing the size of the respective contact holes 231, to a greater extent than in the case where the contact holes 231, are disposed in a broken fashion, for instance in a zigzag fashion. The frame can be made yet narrower thereby.

The contact holes 231 are provided between the sealing material 255 and a region at which the ACF 280 and the wirings 271 of the rigid-FPC 270 overlap each other, in a plan view of the TFT substrate 211. Between the ACF 280 and the sealing material 255 there is designed a required margin region, on the basis of the registration precision during affixing of the ACF and sealing position precision, such that ordinarily no pressure is exerted onto this region during thermocompression bonding. Therefore, enlargement of the frame section can be kept to a minimum, while suppressing connection faults, by arranging the contact holes 231 at this margin region.

The plane-view shape of the contact holes 231 is not particularly limited. Also, the contact holes 213 may be divided each into a. plurality of contact holes.

The liquid crystal display device of Embodiment 2 can be manufactured in accordance with the same manufacturing method as that of the liquid crystal display device of Embodiment 1, and hence a recurrent explanation of the manufacturing method will be omitted.

Variations of the present embodiment are explained next.

Figure 4:
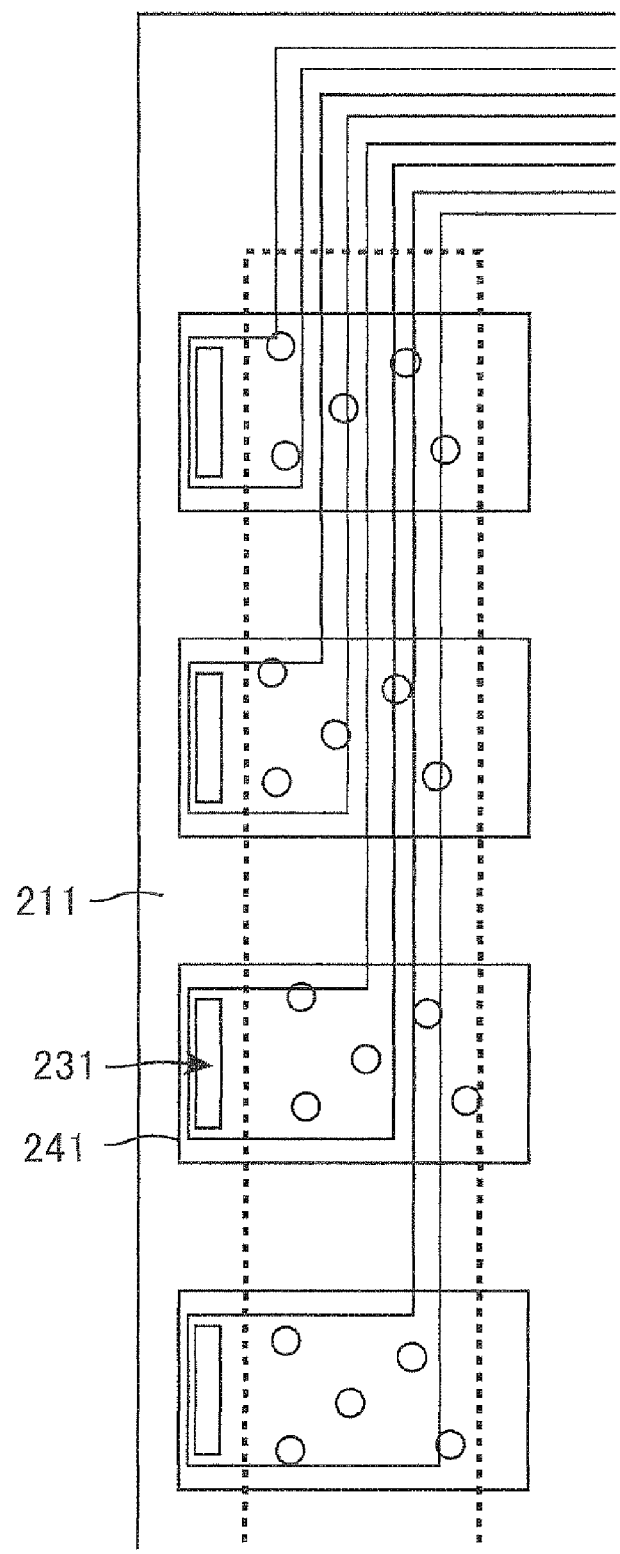
FIG. 4 is a plan-view schematic diagram illustrating a variation of the configuration of the frame section in the liquid crystal display device of Embodiment 2.

FIG. 4 is a plan-view schematic diagram illustrating a variation of the configuration of the frame section in the liquid crystal display device of Embodiment 2. As illustrated in FIG. 4, the contact holes 231 may be disposed outward of the external connection terminals 241 (on the outer peripheral side of the TFT substrate 211).

Figures 1, 5:
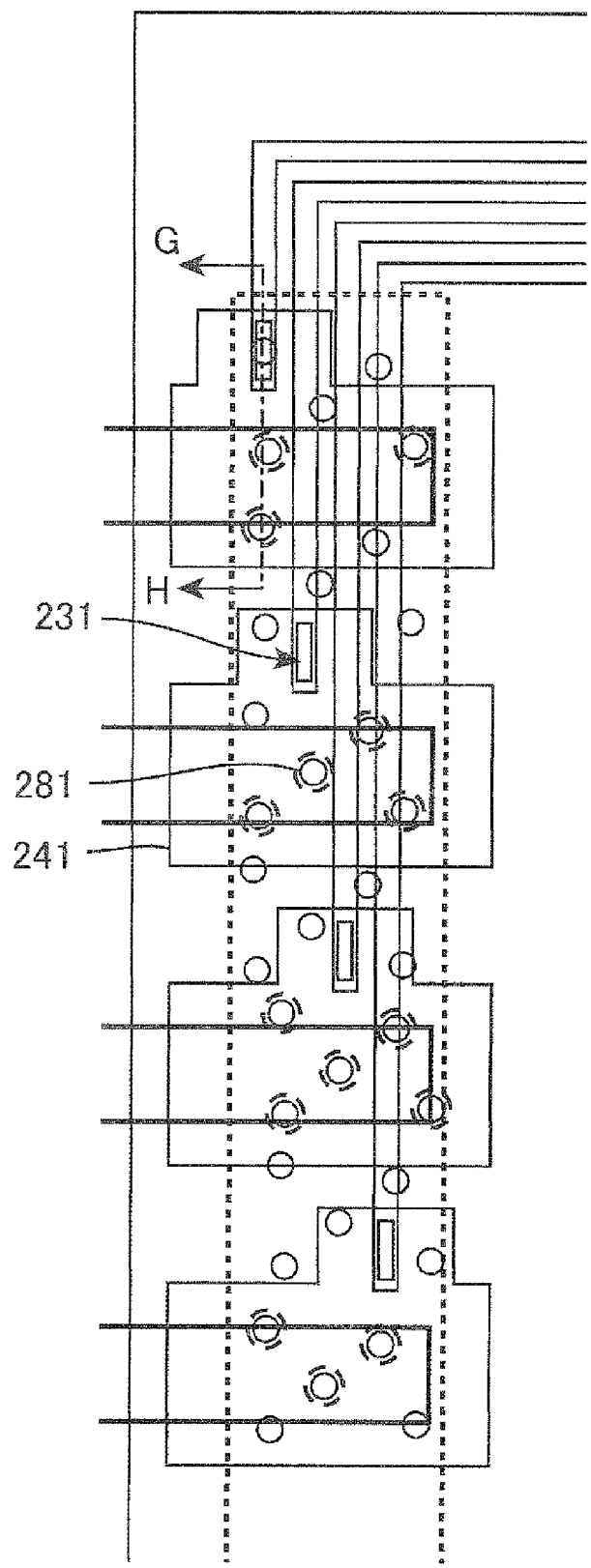
Figures 2, 5:
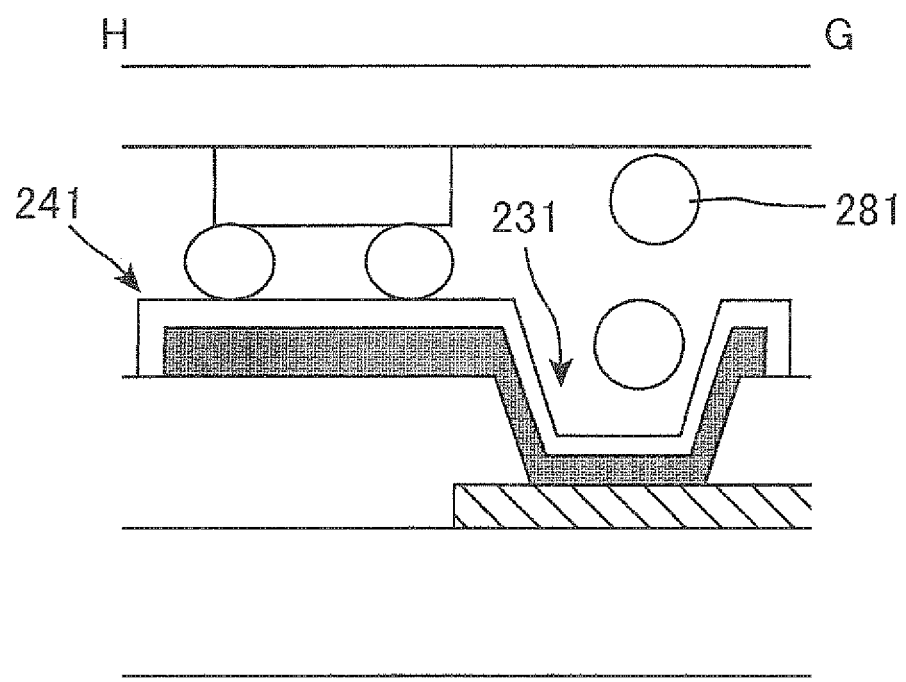

FIG. 5-1 is a plan-view schematic diagram illustrating a variation of the configuration of the frame section in the liquid crystal display device of Embodiment 2. FIG. 5-2 is a cross-sectional schematic diagram, along line G-H in FIG. 5-1, illustrating the variation of the configuration of the frame section in the liquid crystal display device of Embodiment 2. In FIG. 5-1, the conductive beads 281 on which pressure is exerted are enclosed by a broken line. As illustrated in FIG. 5-1 and FIG. 5-2, the contact holes 231 may be disposed between adjacent wirings 271 of the rigid-FPC 270. In this case as well, pressure can be prevented from being exerted, via the conductive beads 281, onto the external connection terminals 241 at a portion thereof having a small film thickness within the contact holes 231, during thermocompression bonding.

Figures 1, 6:
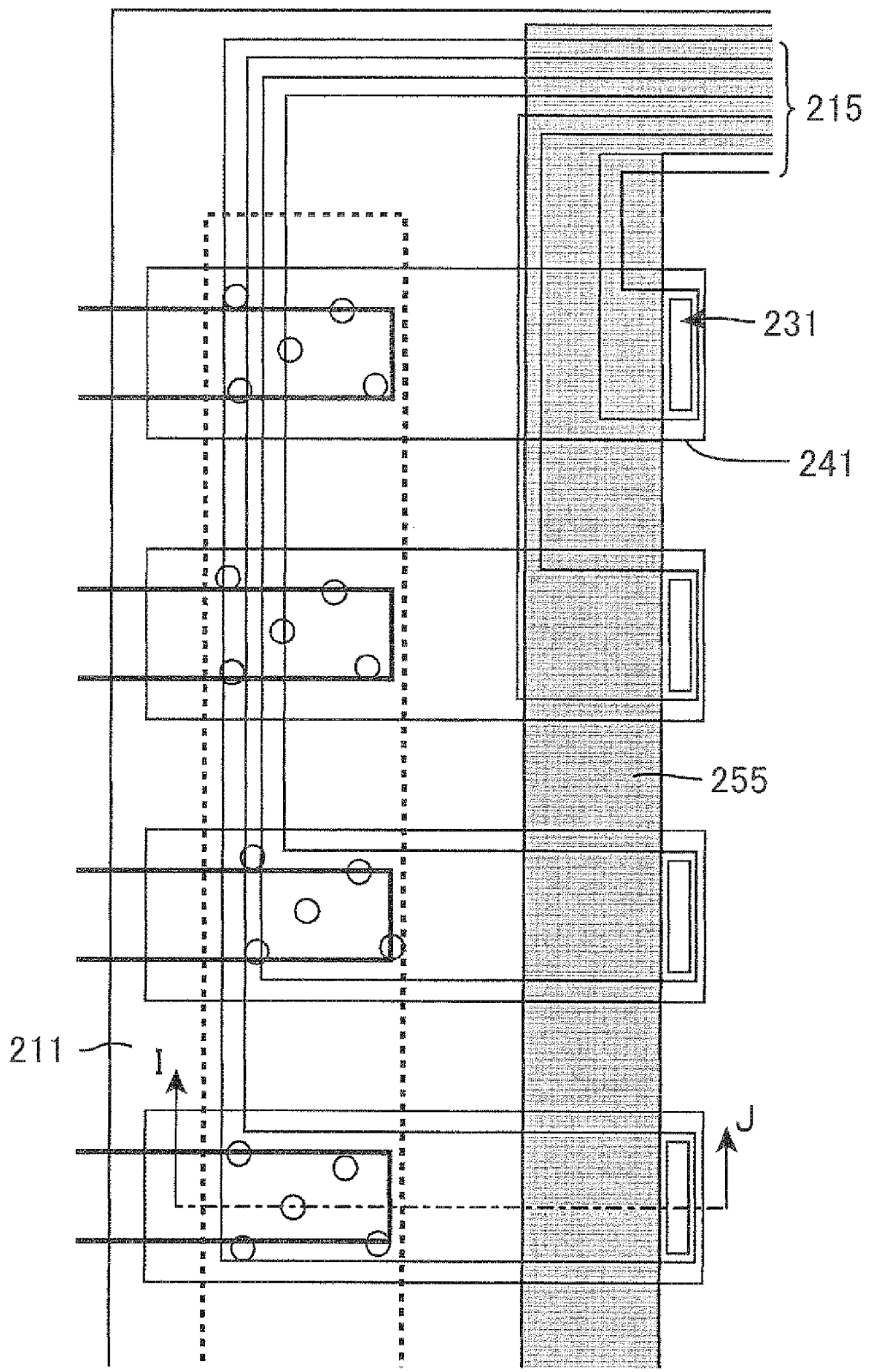
Figures 2, 6:
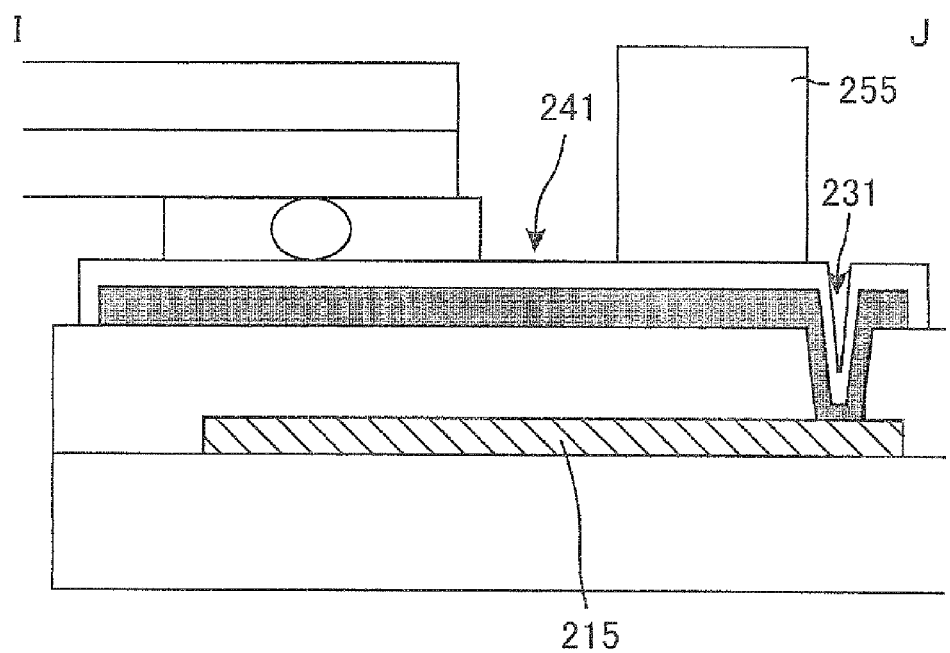

FIG. 6-1 is a plan-view schematic diagram illustrating a variation of the configuration of the frame section in the liquid crystal display device of Embodiment 2. FIG. 6-2 is a cross-sectional schematic diagram, along line I-J in FIG. 6-1, illustrating the variation of the configuration of the frame section in the liquid crystal display device of Embodiment 2. As illustrated in FIG. 6-1 and FIG. 6-2, the contact holes 231 may be disposed further inward of the TFT substrate 211 (towards the center of the TFT substrate 211) than the sealing material 255, in a plan view of the TFT substrate 211. That is, the contact holes 231 are positioned inward of a liquid crystal layer, in a plan view of the TFT substrate 211. This allows enhancing, as a result, the reliability of the contact portions between the common wirings 215 and the external connection terminals 241.

Figures 1, 7:
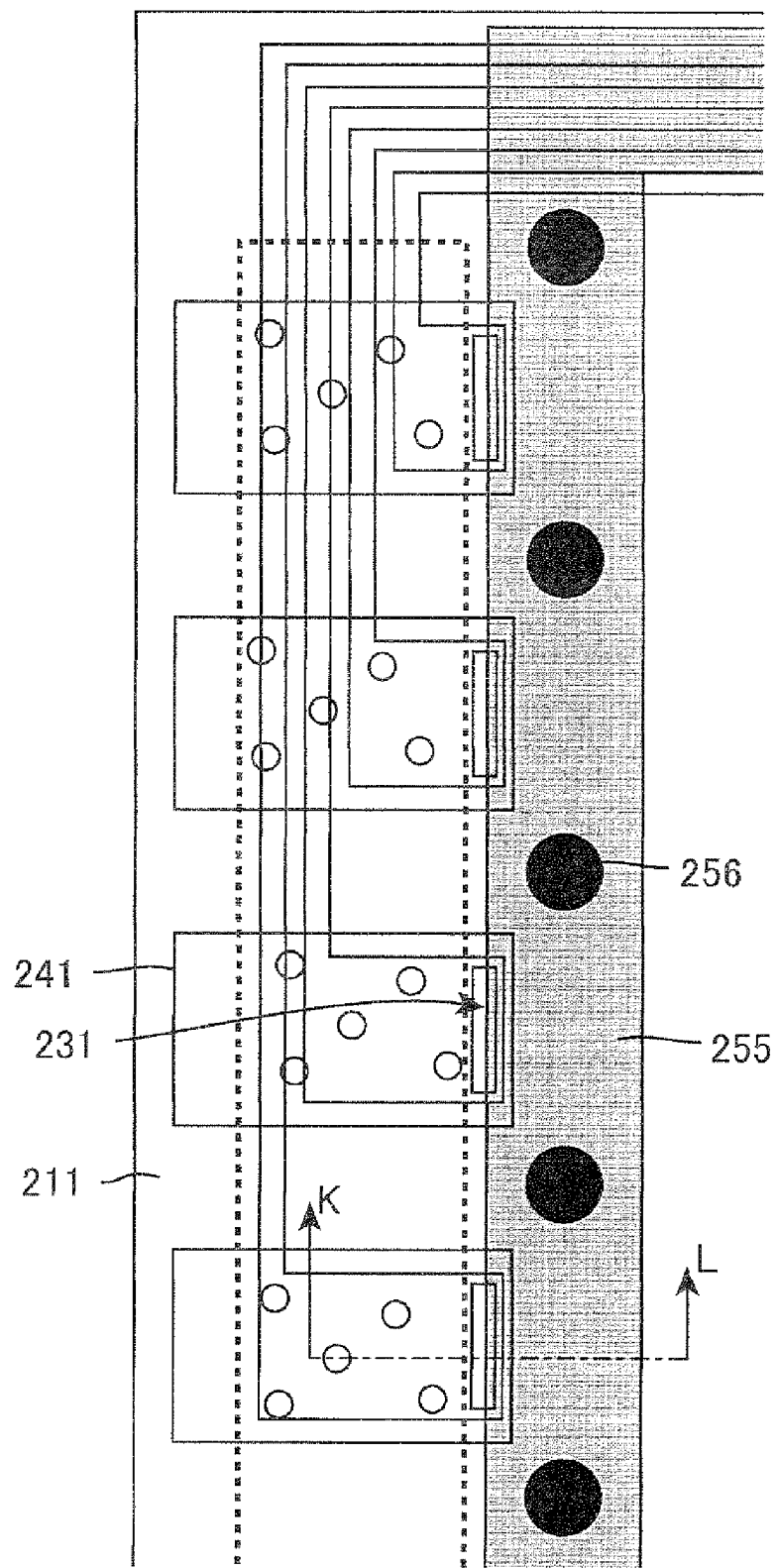
Figures 2, 7:
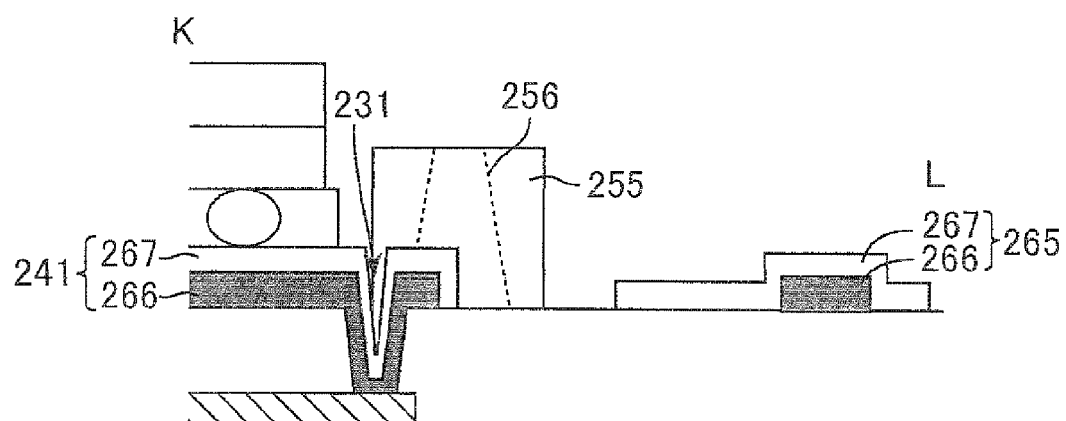

FIG. 7-1 is a plan-view schematic diagram illustrating a variation of the configuration of the frame section in the liquid crystal display device of Embodiment 2. FIG. 7-2 is a cross-sectional schematic diagram, along line in K-L in FIG. 7-1, illustrating the variation of the configuration of the frame section in the liquid crystal display device of Embodiment 2. As illustrated in FIG. 7-1 and FIG. 7-2, the contact holes 231 may overlap the sealing material 255, in a plan view of the TFT substrate 211, and the TFT substrate 211 may have photo-spacers 256 formed in the sealing material 255. Glass fibers may be comprised in the sealing material 255 as the spacers. In such a case, the portion of small film thickness of the external connection terminals 241 in the contact holes 231 may become damaged by the glass fibers, if the contact holes 231 are disposed so as to overlap the sealing material 255 with a view to achieving a narrower frame and/or enhancing reliability. This may give rise to faults such as connection faults. The photo-spacers 256 are formed by patterning of a photosensitive resin or non-photosensitive resin, by photolithography, and hence the position of the photo-spacers 256 can be easily controlled with precision. Therefore, the contact holes 231 and the photo-spacers 256 can be prevented from overlapping by using spacers in the form of the photo-spacers 256, even if the sealing material 255 is provided so as to overlap the contact holes 231. Thus, the present variation affords a narrower frame and greater reliability, while suppressing faults such as connection faults.

In the present variation, the contact holes 231 may overlap the sealing material 255 partially or entirely. Also, the photo-spacers 256 may be formed on the side of the CF substrate.

The present variation is a semitransmissive-type liquid crystal display device and there are formed reflective/transmissive type pixel electrodes 265 having the same configuration as the external connection terminals 241 formed therein. Each pixel electrode 265 is a stack of a lower-layer conductive film 266 doubling as a reflective conductive film that makes up a reflective portion, and a higher-layer conductive film 267 doubling as a transparent conductive film that makes up a light-transmitting portion. The lower layer conductive film 266 is formed by depositing an aluminum (Al) film having a film thickness of 350 nm, by sputtering or the like, followed by photolithographic patterning. The higher-layer conductive film 267 is formed by depositing an IZO film having a film thickness of 100 nm, by sputtering or the like, followed by photolithographic patterning.

Figures 1, 8:
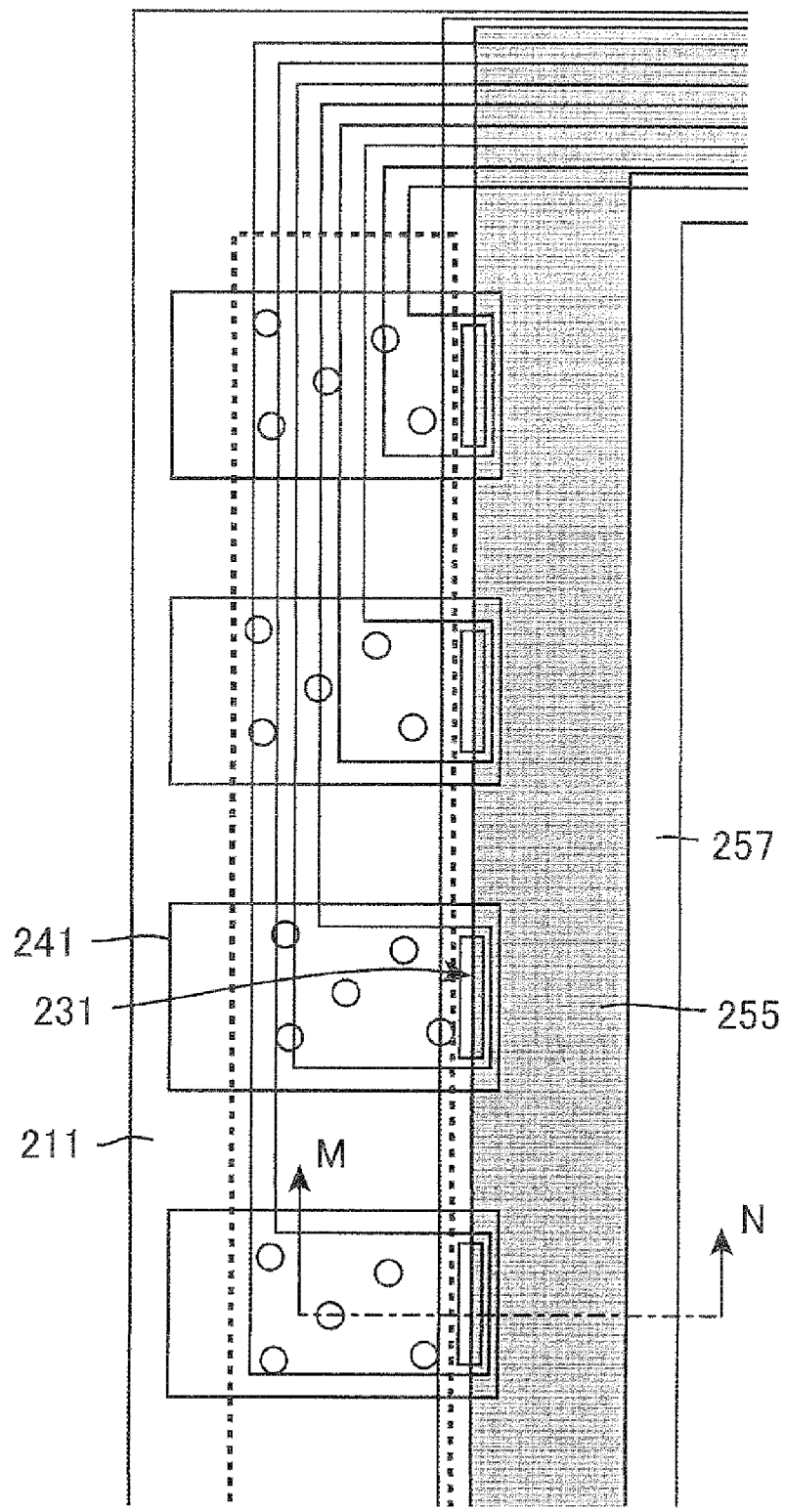
Figures 2, 8:
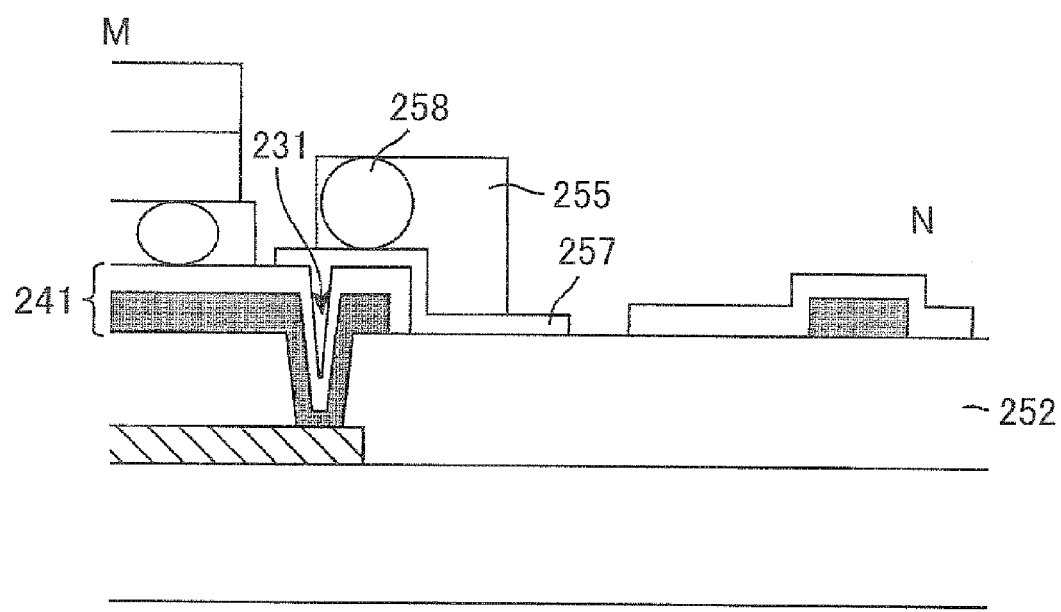

FIG. 8-1 is a cross-sectional schematic diagram illustrating a variation of the configuration of the frame section in the liquid crystal display device of Embodiment 2. FIG. 8-2 is a cross-sectional schematic diagram, along line M-N in FIG. 8-1, illustrating the variation of the configuration of the frame section, in the liquid crystal display device of Embodiment 2. As illustrated in FIG. 8-1 and FIG. 8-2, the contact hales 231 may overlap the sealing material 255, in a plan view of the TFT substrate 211. The TFT substrate 211 may have an insulating film 257 below the sealing material 255, more specifically, at least at a region at which the contact holes 231 and the sealing material 255 overlap each other. The spacers in the sealing material 255 comprise glass fibers 258. As a result, this allows preventing the occurrence of faults such as connection faults arising from the damage caused by the glass fibers 258 on the portion of small film thickness of the external connection terminals 241 in the contact holes 231, even in a case where the contact holes 231 are disposed so as to overlap the sealing material 255. Thus, the above configuration as well affords a narrower frame and greater reliability, while suppressing faults such as connection faults.

In a case where the interlayer dielectric 252 is formed out of an organic insulating film, the latter may become damaged upon formation of the insulating film 257 by CVD. Preferably, therefore, the insulating film 257 is formed by a method, such as sputtering or the like, that does not damage the interlayer dielectric. Examples of the material of the insulating film 257 include, for instance, silicon oxide (such as $SiO_2$). The insulating film 257 may be formed, for instance, by forming a $SiO_2$ film by sputtering, followed by photolithographic patterning.

The insulating film 257 is disposed below substantially the entire sealing material 255, excluding a contact portion with the opposed substrate. As a result, this allows suppressing loss of display quality derived from uneven cell thickness on account of level differences within the insulating film 257.

In the present variation, the contact holes 231 may overlap the sealing material 255 partially or entirely.

Figure 9:
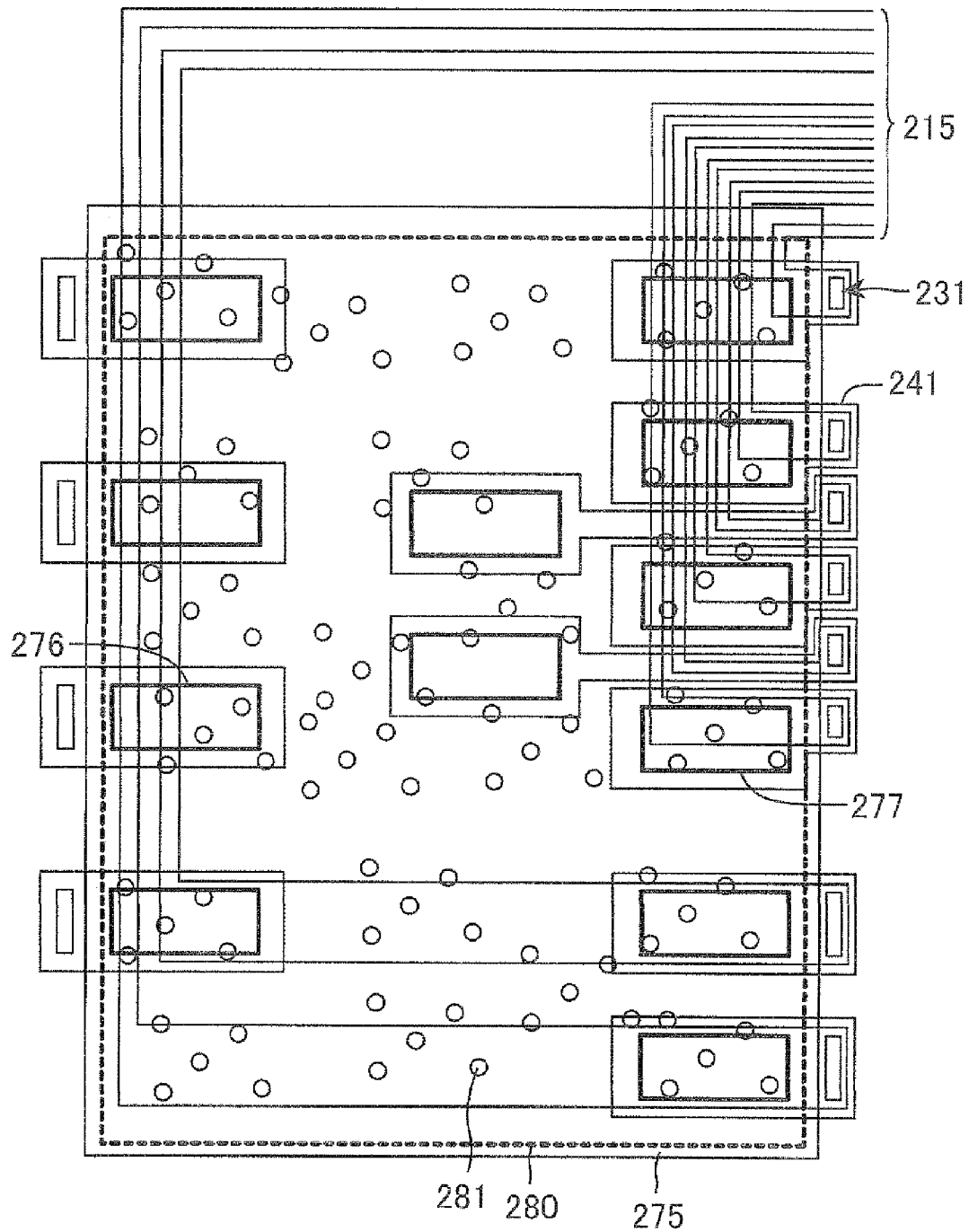
FIG. 9 is a plan-view schematic diagram illustrating a variation of the configuration of the frame section in the liquid crystal display device of Embodiment 2.
Figure 10:
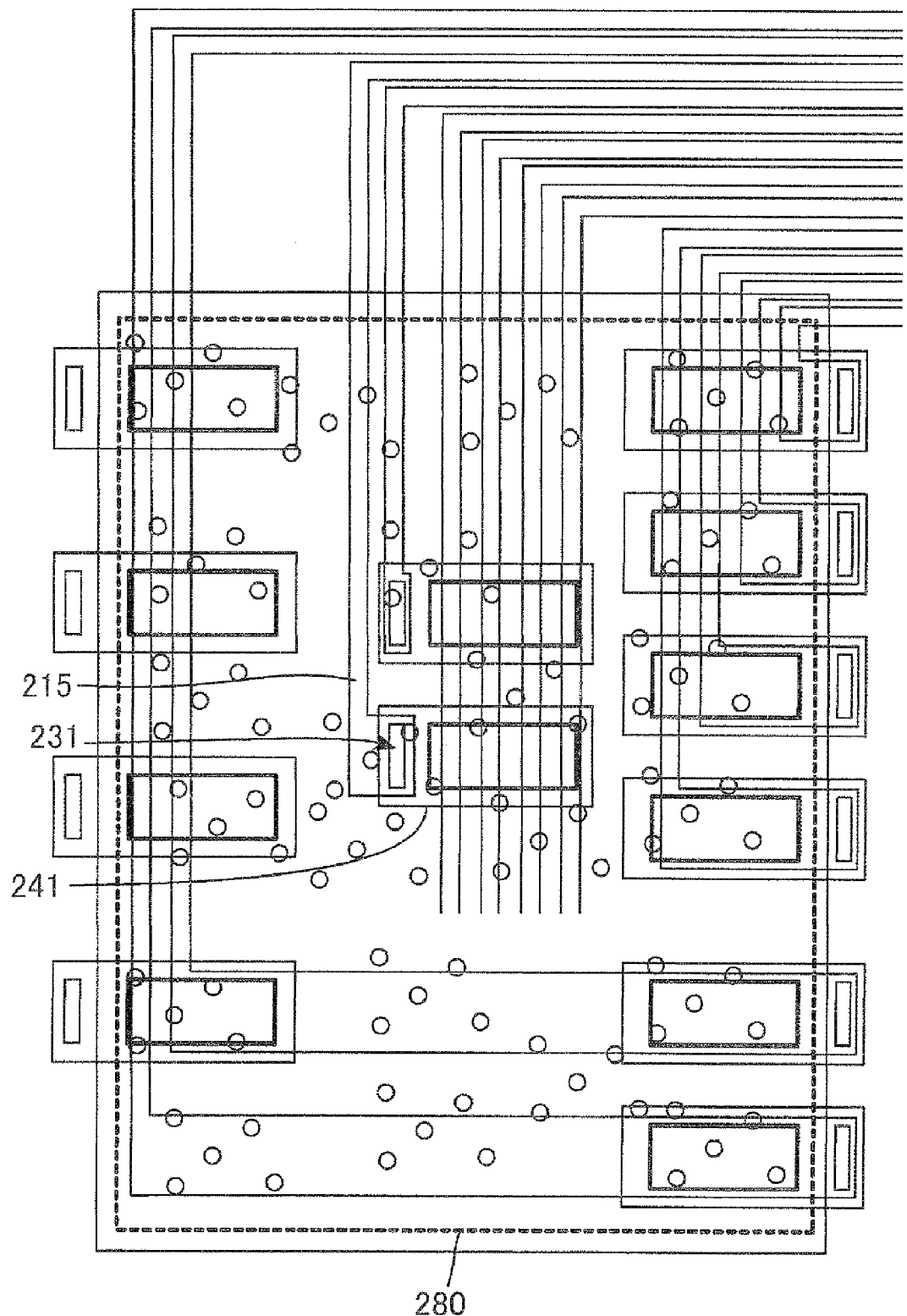
FIG. 10 is a plan-view schematic diagram illustrating a variation of the configuration of the frame section in the liquid crystal display device of Embodiment 2.
Figure 11:
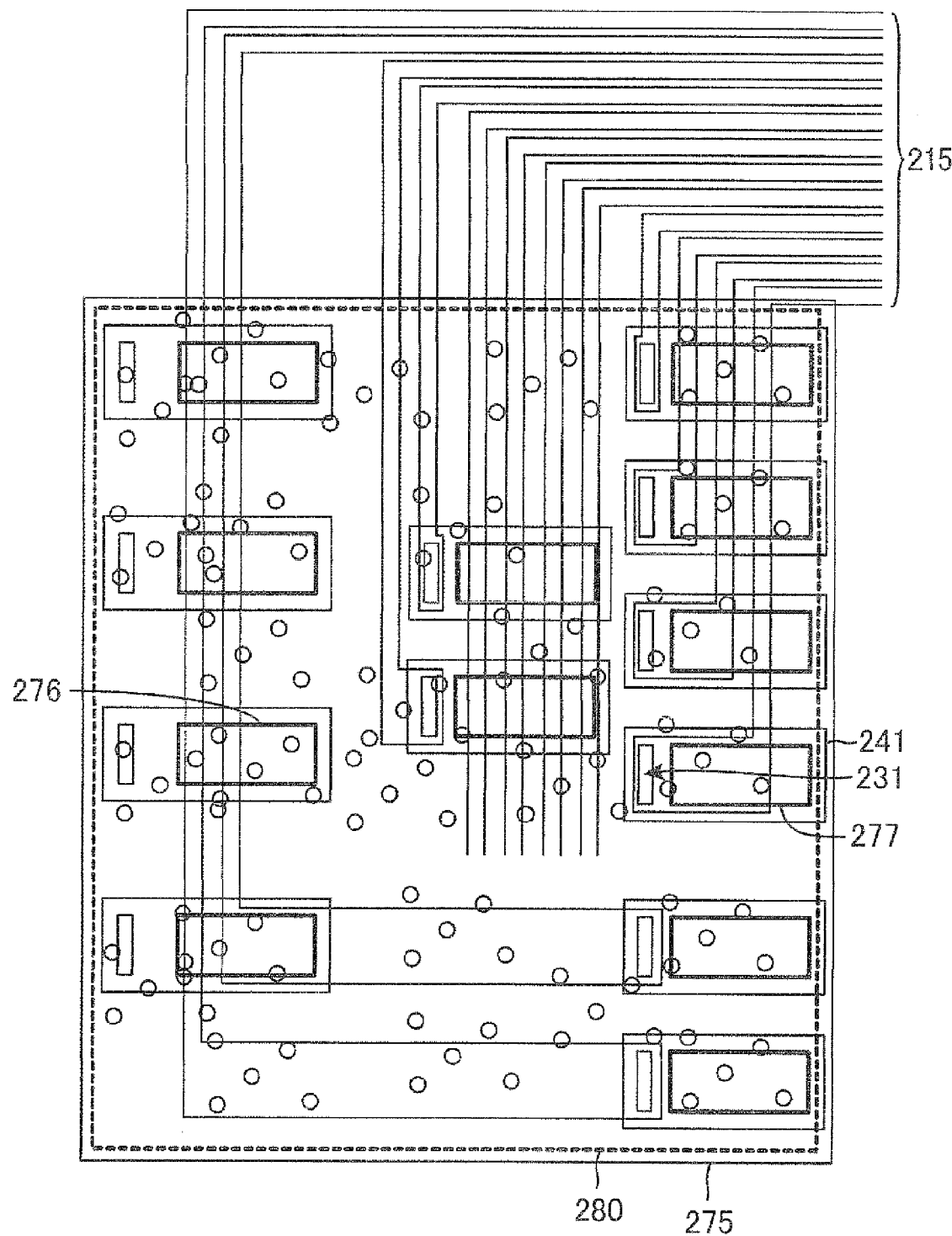
FIG. 11 is a plan-view schematic diagram illustrating a variation of the configuration of the frame section in the liquid crystal display device of Embodiment 2.

FIGS. 9 to 11 are plan-view schematic diagrams illustrating a variation of the configuration of the frame section in the liquid crystal display device of Embodiment 2. The IC chip 275 may be connected to the TFT substrate 211, as illustrated in FIG. 9. The IC chip 275 has signal input bumps 276 and signal output bumps 277. The bumps 276, 277 function as connection terminals (connection portions) of the IC chip 275. The IC chip 275 is mounted, as a bare chip, on the TFT substrate 211, according to a COG (Chip on Glass) technique.

The external connection terminals 241 are connected to the signal input bumps 276 and the signal output bumps 277, and are led out of the ACF 280. The external connection terminals 241 are connected to the common wirings 215, by way of the contact holes 231, at a region where the external connection terminals 241 and the ACF 280 do not overlap each other. In this case as well, pressure can be prevented from being exerted, via the conductive beads 281, onto the external connection terminals 241 at a portion thereof having a small film thickness within the contact holes 231, during thermocompression bonding.

It is sufficient that the contact holes 231 do not overlap with both the signal input bumps 276 or the signal output bumps 277 and the ACF 280 Therefore, the external connection terminals 241 may be connected to the common wirings 215 by way of the contact holes 231 that overlap only the ACF 280, as illustrated in FIG. 10.

As illustrated in FIG. 11, the contact holes 231 may be provided at a region, within the region of overlap with the IC chip 275, that excludes the regions at which the signal input bumps 276 or the signal output bumps 277 overlap the ACF 280, such that the external connection terminals 241 and the common wirings 215 are connected at those regions where the contact holes 231 are provided. As a result, the external connection terminals 241 can be disposed within a region overlapping the IC chip 275, and hence the frame can be made further narrower.

(Embodiment 3)

Figure 12:
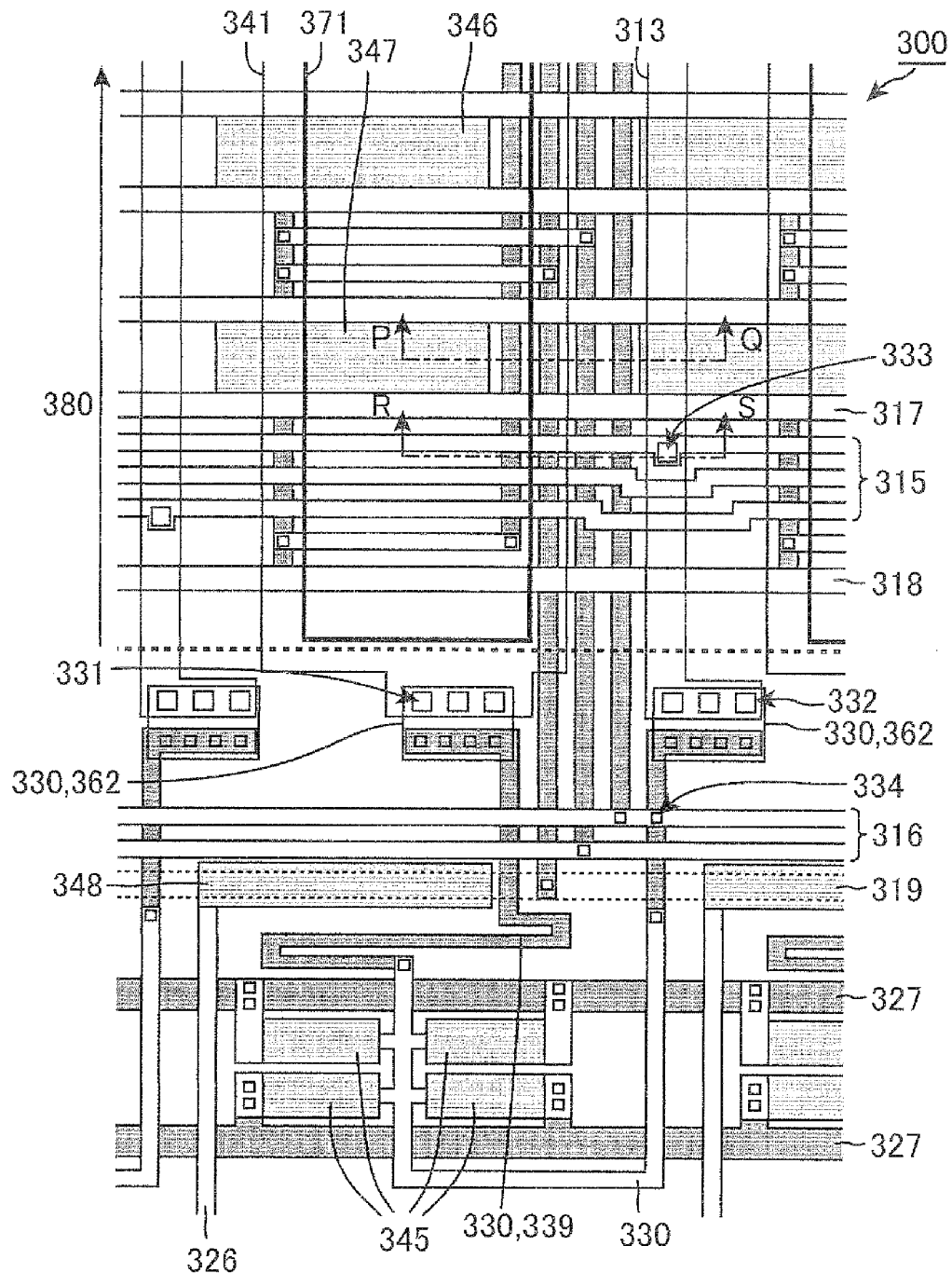
FIG. 12 is a plan-view schematic diagram illustrating the configuration of a frame section in a liquid crystal display device of Embodiment 3.
Figure 13:
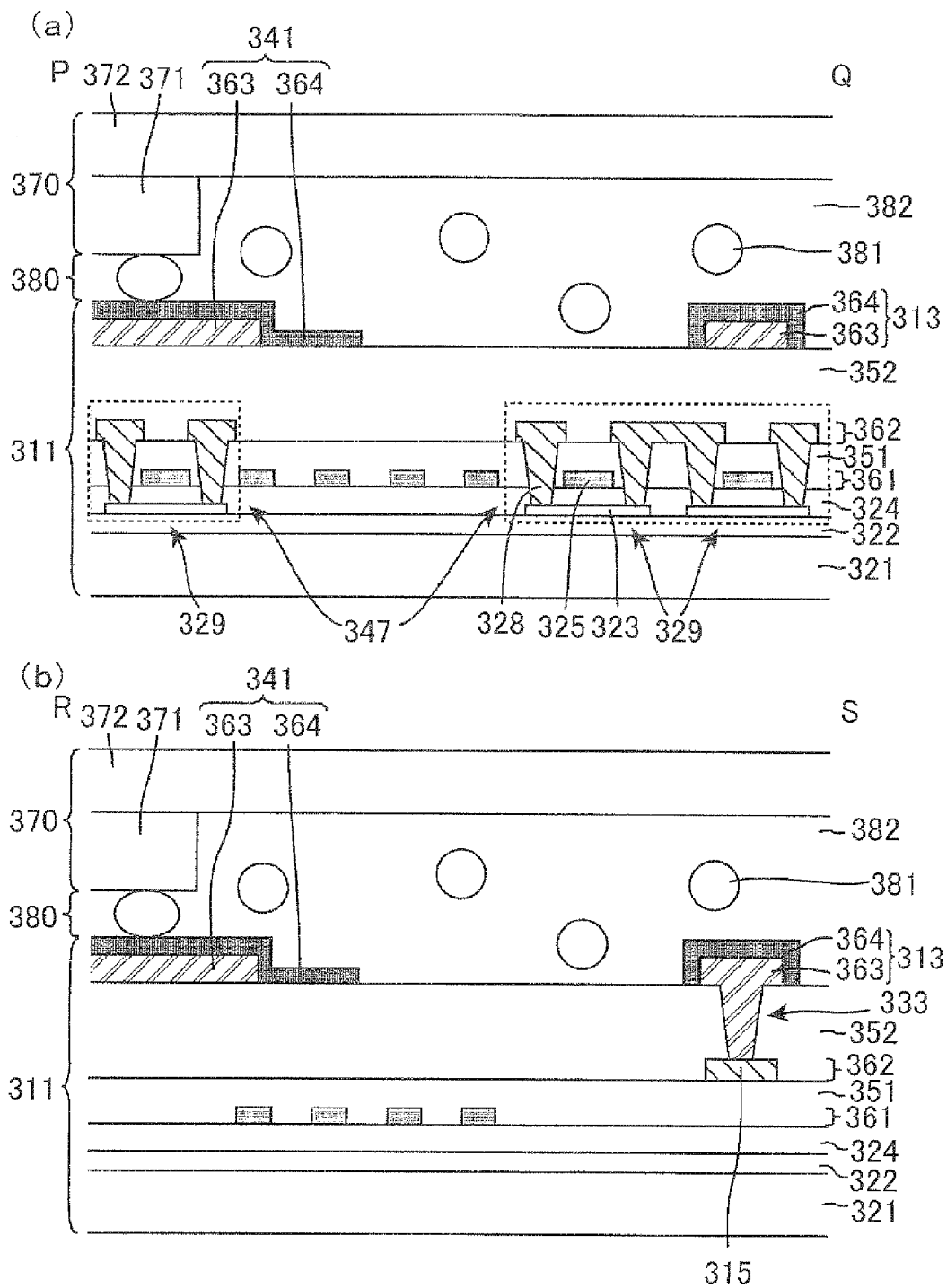

FIG. 12 is a plan-view schematic diagram illustrating the configuration of a frame section (outer peripheral section outside a display region) of a liquid crystal display device of Embodiment 3. FIG. 13 is a cross-sectional schematic diagram illustrating the configuration. of a frame section of the liquid crystal display device in Embodiment 3, wherein FIG. 13(a) is a cross-sectional diagram along line P-Q in FIG. 12, and FIG. 13(b) is a cross-sectional diagram along line R-S in FIG. 12.

As illustrated in FIG. 12 and FIG. 13(a) and FIG. 13(b), the liquid crystal display device 300 of the present embodiment has a structure in which a TFT substrate 311, being a display device substrate, and a rigid-FPC 370, being an external connection component, are connected to each other, at a frame section, by way of an ACF 380.

As illustrated in FIG. 13(a) and FIG. 13(b), the TFT substrate 311 has a structure wherein, at the frame section, an insulating substrate 321 has sequentially stacked thereon, from the side of the insulating substrate 321, a base coat film 322, a semiconductor layer 323, a gate insulator 324, a first wiring layer 361, an interlayer dielectric 351, a second wiring layer 362, an interlayer dielectric 352, a third wiring layer 363, and a transparent conductive layer 364.

Besides the TFT substrate 311, the liquid crystal display device 300 has a CF substrate disposed opposite the TFT substrate 311. The CF substrate comprises an insulating substrate, and sequentially stacked thereon, from the side of the insulating substrate: (1) a black matrix comprising a light-shielding member, and a red, green and blue color filter; (2) an overcoat layer; (3) a common electrode comprising a transparent conductive film; and (4) an alignment film. The outer peripheral section of the CF substrate and the TFT substrate 311 is sealed by a sealing material provided in the form of a frame. A liquid crystal material is filled in between the TFT substrate 311 and the CF substrate. The rigid-FPC 370 is disposed on the TFT substrate 311, outward of the region at which the TFT substrate 311 and the CF substrate oppose each other.

The rigid-FPC 370 has formed thereon wirings 371 juxtaposed parallelly to each other on the base material 372. These wirings 371 function as connection terminals (connection portions) of the rigid-FPC 370. Electronic components such as various kinds of chips that make up a liquid crystal controller, a power supply IC or the like, as well as resistors, capacitors and the like, are mounted on the rigid-FPC 370.

On the TFT substrate 311 there are formed external connection terminals 341, corresponding to the wirings 371 of the rigid-FPC 370, juxtaposed parallelly to each other in a row. Higher-layer wirings 313, being formed from the same layer as that of the external connection terminals 341, are provided between adjacent external connection terminals 341. The higher-layer wirings 313 are provided at a region not overlapping the wirings 371 of the rigid-FPC 370.

The ACF 380 is provided so as to cover the external connection terminals 341 (region above the thick broken line in FIG. 12). The external connection terminals 341 are connected to the wirings 371 of the rigid-FPC 370 by way of conductive beads (conductive particles) 381 that are a conductive member in the ACF 380.

The external connection terminals 341 and the higher-layer wirings 313 are formed using a stack of the third wiring layer 363 and the transparent conductive layer 364, and are connected by way of routing wirings 330 that are provided outside the region at which the ACF 380 and the wirings 371 of the rigid-FPC 370 overlap each other. The routing wirings 330 are formed by the first wiring layer 361 and the second wiring layer 362. More specifically, both end portions of the routing wirings 330 are formed by the second wiring layer 362, such that one end portion of the routing wirings 330 is connected to the external connection terminals 341, formed at a layer above the interlayer dielectric 352, by way of contact holes 331 that are provided in the interlayer dielectric 352, while the other end portion of the routing wirings 330 is connected to the higher-layer wirings 313 formed at a layer above the interlayer dielectric 352, by way of contact holes 332 provided in the interlayer dielectric 352. Both end portions of the routing wirings 330 function thus as wiring connection portions.

The contact holes 331 are provided collinearly for the end portions of the external connection terminals 341 that are positioned on the inward side of the TFT substrate 311, at a region not overlapping the ACF 380. The contact holes 331 are disposed outside the region at which the ACF 380 and the wirings 371 of the rigid-FPC 370 overlap each other. Therefore, the external connection terminals 341 are each connected to any of the routing wirings 330 outside the region at which the wirings 371 and the ACF 380 overlap each other. That is, the external connection terminals 341 are separately provided at a portion connected to the wirings 371 of the rigid-FPC 370 (portion in contact the conductive beads 381), and a portion connected to the routing wirings 330 (portion in contact the wiring connection portions of the routing wirings 330). The portions connected to the routing wirings 330 are disposed so as not to overlap either the ACF 380 or the wirings 371 of the rigid-FPC 370.

The contact holes 332 are provided collinearly for the end portions of the higher-layer wirings 313 that are positioned on the inward side of the TFT substrate 311, at a region not overlapping the ACF 380. The contact holes 332 are disposed outside the region at which the ACF 380 and the wirings 371 of the rigid-FPC 370 overlap each other, such that the higher-layer wirings 313 are each connected to any of the routing wirings 330 outside the region at which the wirings 371 and the ACF 380 overlap each other. The portions of the higher-layer wirings 313 that are connected to the routing wirings 313 are disposed so as not to overlap either the ACF 380 or the wirings 371.

The higher-layer wirings 313 are connected to any of the wiring connection portions of the common wirings 315, which are lower-layer wirings formed at a layer below the interlayer dielectric 352, by way of the contact holes 333 that are provided in the interlayer dielectric 352. The common wirings 315 are juxtaposed across the external connection terminals 341, below the latter, along the outer periphery of the TFT substrate 311, i.e. along the array direction of the external connection terminals 341 (left-right direction in FIG. 12), The common wirings 315 are connected to elements built onto the TFT substrate 311, for instance semiconductor elements, capacitors and resistors. The above-mentioned semiconductor elements are ordinarily transistors, more specifically, TFTs. The higher-layer wirings 313 are substantially perpendicular to the common. wirings 315, in a plan view of the TFT substrate 311. The common wirings 315 are signal wirings for signal transmission. Each of the common wirings 315 is connected to two or more elements, for instance semiconductor elements, capacitors and resistors, and supply a common signal. As a result, the various signals supplied from the rigid-FPC 370 are transmitted to various elements on the TFT substrate 311, for instance semiconductor elements, capacitors and resistors, by way of the external connection terminals 341, the routing wirings 330, the higher-layer wirings 313 and the common wirings 315. The common wirings 315 may be connected to the gate electrodes of TFTs in which a semiconductor layer, a gate insulator and a gate electrode are stacked in this order.

The contact holes 333 are provided at a region of overlap with the ACF 380. However, the contact holes 333 are disposed outside the region at which the ACF 380 and the wirings 371 of the rigid-FPC 370 overlap each other, such that the higher-layer wirings 313 are each connected to any of the routing wirings 315 outside the region at which the wirings 371 and the ACF 380 overlap each other. That is, the portions of the higher-layer wirings 313 connected to the common wirings 315 are disposed so as not to overlap either the ACF 380 or the wirings 371 of the rigid-FPC 370.

ESD (electrostatic discharge) protection circuits 345, which are provided further inward of the TFT substrate 311 than the external connection terminals 341, are connected to the routing wirings 330. The routing wirings 330 are connected to any of the common wirings 316 formed by the second wiring layer 362, by way of the contact holes 334 provided in the interlayer dielectric 352. The ESD protection circuits 345 are connected to common wirings 327. The common wirings 327 join respective ESD circuits and are formed by the first wiring layer 361. The ESD protection circuits 345 are provided collinearly along a line parallel to common wirings such as the common wirings 315 and the common wirings 316. The portion of the routing wirings 330 up to the point where the latter are connected to the ESD protection.

circuits 345 is formed by the first wiring layer 361, and functions as a high-resistance region 339.

Circuit blocks 346, 347 that comprise a TFT 329 and routing wiring, as well as a circuit block 348 further inward of the TFT substrate 311 than the external connection terminals 341, are directly built onto the region of the TFT substrate 311 that overlaps the rigid-FPC 370. Source drivers, gate drivers, and power supply circuits are formed in the circuit blocks 346, 347, 348. As illustrated in FIG. 13(*a*), the TFT 329 comprises the semiconductor layer 323, the gate insulator 324 and a gate electrode 325 comprising the first wiring layer 361. Source/drain wiring 328, comprising the second wiring layer 362, is connected to source/drain regions of the semiconductor layer 323, by way of contact holes that run through the interlayer dielectric 351 and the gate insulator 324.

Source lines 326, formed by the second wiring layer 362, transmit image signals to each pixel, from the circuit block 348. In the TFT substrate 311 there are also provided, for instance, common wirings 317, 318, formed by the second wiring layer 362 and functioning as power supply wiring, and common wirings 319 formed by the third wiring layer 363 and functioning as power supply wiring.

The TFT substrate 311 and the rigid-FPC 370 are thermocompression-bonded via the ACF 380 and become thereby connected to each other by the conductive beads 381 comprised in the ACF 380, and the TFT substrate 311 and the rigid-FPC 370 are fixed to each other by way of an adhesive component 382 that comprises a thermosetting resin or the like and that is comprised in the ACF 380.

During thermocompression bonding, pressure is exerted, by way of the conductive beads 381, onto the external connection terminals 341 and the corresponding wirings 371 of the rigid-FPC 370. Therefore, in a hypothetical case where the contact holes 331 are provided at a region at which this pressure is exerted. (region at which the wirings 371 and the conductive beads 381 overlap each other), the pressure is then exerted also onto the external connection terminals 341 at a portion thereof positioned within the contact holes 331 and that is ordinarily a portion of small film thickness. As a result, the external connection terminals 341 at that portion may be crushed, and connection faults may occur at that portion, during thermocompression bonding. When using a conductive member in the form of the conductive beads 381 comprised in the ACF 380, in particular, a concern arises in that the external connection terminals 341 may become cut in the form of a ring, and connection faults may occur frequently.

In the liquid crystal display device 300, by contrast, the contact holes 331 are disposed outside the region at which the conductive beads 381 and the wirings 371 of the rigid-FPC 370 overlap each other, in a plan view of the TFT substrate 311. During thermocompression bonding, therefore, the conductive beads 381 are brought into contact only with the comparatively thick portion at the top face of the external connection terminals 341. This allows preventing pressure from being exerted, via the conductive beads 381, onto the external connection terminals 341 at a portion thereof, having small film thickness, within the contact holes 331, during thermocompression bonding. As a result there can be suppressed the occurrence of connection faults between the TFT substrate 311 and the rigid-FPC 370 due to crushing of the external connection terminals 341.

The higher-layer wirings 313 are provided at a region not overlapping the wirings 371 of the rigid-FPC 370, and are disposed so as not to be directly connected to the wirings 371. Therefore, no pressure is exerted, by way of the conductive beads 381, onto the portion of small film thickness of the higher-layer wirings 313 in the contact holes 333, during thermocompression bonding, even if the conductive beads 381 (ACF 380) overlap the higher-layer wirings 313.

The higher-layer wirings 313 are electrically connected to the external connection terminals 341 by way of the wiring connection portions of the routing wirings 330, overlap the rigid-FPC 370 in a plan view of the TFT substrate 311, and comprise the same conductive layer as the conductive layer that makes up the external connection terminals 341. The higher-layer wirings 313 are connected to the common wirings 315, as lower-layer wiring, by way of the contact holes 333 in the interlayer dielectric 352. As a result, the various circuits such as the ESD protection circuits 345 are connected to an electric path (in the present embodiment, the routing wirings 330) between the external connection terminals 341 and the common wirings 315. That is, the performance of the TFT substrate 311 can be enhanced while achieving a narrower frame. For instance, signals can be supplied from the rigid-FPC 370 to the semiconductor elements on the TFT substrate 311, while suppressing deterioration or destruction of the semiconductor elements due to noise and/or electrostatic discharge from the rigid-FPC 370, by providing the ESD protection circuits 345 that are connected to an electric path between the external connection terminals 341 and the higher-layer wirings 313.

The thin gate insulator is ordinarily susceptible to noise and electrostatic discharge. As a result, the semiconductor elements are likely to deteriorate or be destroyed, in a case where the common wirings 315, as lower-layer wiring, are connected to the gate electrodes of the TFTs. Therefore, the ESD protection circuits 345 allow suppressing deterioration or destruction of the semiconductor elements, in a particularly effective manner, in an configuration wherein the common wirings 315, which are connected to the external connection terminals 341 and the higher-layer wirings 313, are electrically connected to the gate electrodes of the TFTs. Preferably, each of the common wirings 315 is connected to two or more semiconductor elements. The above-mentioned semiconductor elements are ordinarily transistors, more specifically, TFTs. The TFTs connected to the common wirings 315 may be of top gate type, in which a semiconductor layer, a gate insulator and gate electrode are stacked in this order from the side of the insulating substrate, or of back (bottom) gate type, in which a gate electrode, a gate insulator and a semiconductor layer are stacked in this order from the side of the insulating substrate.

Ordinarily, the common wirings 317, common wirings 318 and common wirings 319 that function as power supply wiring need not be connected to ESD protection circuits.

In the liquid crystal display device 300, the higher-layer wirings 313 intersect the common wirings 315. As a result, the higher-layer wirings 313 can be connected to the external connection terminals 341 and to arbitrary common wirings 315 below the external connection terminals 341.

In the liquid crystal display device 300, the higher-layer wirings 313 are connected to the common wirings 315, and the routing wirings 330 are connected to the common wirings 316. That is, at least two wirings from among the common wirings 315, 316 are connected to an electric path between the external connection terminals 341 and the higher-layer wirings 313. As a result, same-potential signals can be transmitted to a plurality of common wirings 315, 316.

The routing wirings 330 at the portion of intersection with the common wirings 316 is formed by the first wiring layer 361, being a layer lower than the common wirings 316. That is, the routing wirings 330 are formed by two or more wiring layers, and the external connection terminals 341 and the higher-layer wirings 313 are connected to each other by way of two or more wiring layers. As a result, the wirings 316 provided at a layer above the routing wirings 330 can be used as common wiring.

The plan-view shape of the contact holes 331, 332, 333, 334 is not particularly limited. The contact holes 331, 332 may be formed out of one hole alone, and the contact holes 333, 334 may be divided into a plurality of holes.

The ESD protection circuits 345 may be provided further on the outer peripheral side of the TFT substrate 311 than the external connection terminals 341.

The liquid crystal display device of Embodiment 3 can be manufactured in accordance with the same manufacturing method as that of the liquid crystal display device of Embodiment 1, and hence a recurrent explanation of the manufacturing method will be omitted.

The present invention has been explained above on the basis of Embodiments 1 to 3. However, the embodiments can be suitably combined with each other without departing from the scope of the present invention.

In Embodiments 1 to 3 and other embodiments, the present invention has been explained based on examples of a liquid crystal display device, but the present invention can also be used in, for instance, organic EL displays, plasma displays, inorganic EL displays or the like. The present invention is particularly suitable for display devices having a display region in which a plurality of pixels are arrayed.

The circuit block (peripheral circuit) formed in the frame section is not particularly limited, and may be a driver circuit including a transmission gate, a latch circuit, a timing generator, an inverter circuit by a power source circuit or the like, or a circuit such as a buffer circuit, a digital-analog conversion circuit (DAC circuit), a shift register or a sampling memory.

The external connection components are not particularly limited, and may be members that are combined in a display device, for instance active elements, passive elements, modules in which passive elements are integrated, wiring substrates (circuit substrates) and the like. Examples of active elements include semiconductor elements such as semiconductor integrated circuits (IC chips), large-scale integrated circuits (LSI chips) or the like. Examples of passive elements include, for instance, resistors, LEDs (Light-emitting Diodes), capacitors, sensors and the like. The wiring substrates are electronic components in which wiring is provided on and/or within an insulating substrate (base material), examples of thereof include, for instance printed boards such as PWBs (Printed Wiring Boards) and FPC boards, and TCPs (Tape Carrier Packages). PWBs may also be referred to as PCBs (Printed Circuit Boards).

The conductive members that are used are not particularly limited, provided that they enable connection between external connection components and the display device substrate, such as a TFT substrate, and may be solder or conductive particles (conductive beads) comprised in an anisotropic conductive material, for instance an anisotropic conductive film, an anisotropic conductive paste or the like.

(Comparative Embodiment 1)

Figures 1, 14:
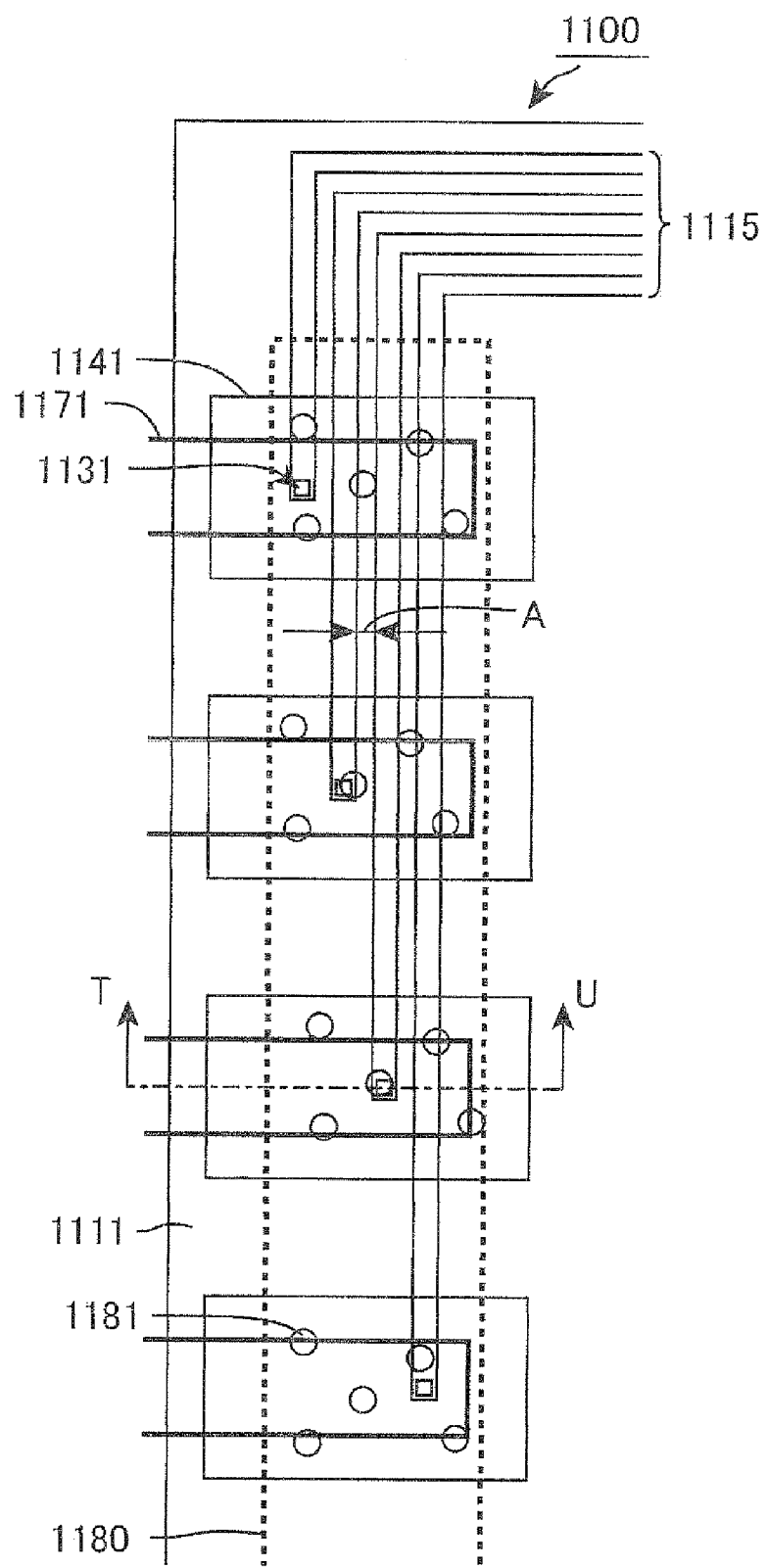
Figures 2, 14:
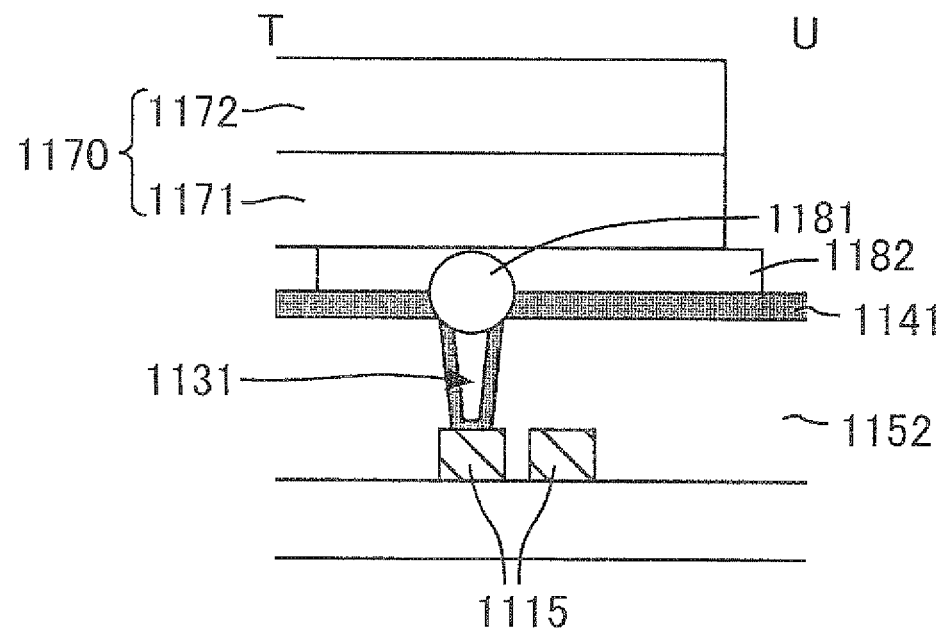

FIG. 14-1 is a cross-sectional schematic diagram illustrating the configuration of a frame section in a liquid crystal display device in Comparative embodiment 1. FIG. 14-2 is a cross-sectional schematic diagram, along line T-U in FIG. 14-1, illustrating the configuration of a frame section in the liquid crystal display device in Comparative embodiment 1.

As illustrated in FIG. 14-1 and FIG. 14-2, the liquid crystal display device 1100 of the present Comparative embodiment has a structure in which a TFT substrate 1111, being a display device substrate, and a FPC substrate 1170, being an external connection component, are connected to each other, at a frame section, by way of an ACF 1180.

In the FPC substrate 1170, wirings 1171 juxtaposed parallelly to each other are formed on a base material 1172, such that the wirings 1171 function as connection terminals (connection portions) of the FPC substrate 1170.

On the TFT substrate 1111 there are formed external connection terminals 1141, corresponding to the wirings 1171 of the FPC substrate 1170, juxtaposed parallelly to each other in a row.

The ACF 1180 is provided so as to cover the external connection terminals 1141. The external connection terminals 1141 are connected to the wirings 1171 of the FPC substrate 170 by way of conductive beads (conductive particles) 1181 that are a conductive member in the ACF 1180.

The external connection terminals 1141 are connected to wiring connection portions positioned at one of the end portions of common wirings 1115, which are lower-layer wirings formed at a layer below the interlayer dielectric 1152, by way of contact holes 1131 that are provided in the interlayer dielectric 1152. The common wirings 1115 extend, along the outer periphery of the TFT substrate 1111, from below the external connection terminals 1141 towards another portion of the frame section of the TFT substrate 1111 at which there are no external connection terminals 1141, and are connected to semiconductor elements that are built onto the TFT substrate 1111. The above-mentioned semiconductor elements are ordinarily transistors, more specifically, TFTs.

The common wirings 1115 are juxtaposed along the array direction of the external connection terminals 1141, below the latter. The contact holes 1131 are provided for the leading ends of the common wirings 1115, in the extension direction of the common wirings 1115, at a region overlapping the ACF 1180. The contact holes 1131 are disposed at a region at which the ACF 1180 and the wirings 1171 of the FPC substrate 1170 overlap each other, such that the external connection terminals 1141 are connected to any common wirings 1115 at a region at which the ACF 1180 and the wirings 1171 of the FPC substrate 1170 overlap each other. Thus, the portion at which the external connection terminals 1141 are connected to the wirings 1171 of the FPC substrate 1170 (portion in contact with the conductive beads 1181) overlaps the portion at which the external connection terminals 1141 are connected to the common wirings 1115 (portion in contact with the wiring connection portions of the common wirings 1115). The portions connected to the common wirings 1115 are disposed overlapping both the ACF 1180 and the wirings 1171 of the FPC substrate 1170.

The TFT substrate 1111 and the FTC substrate 1170 are thermocompression-bonded via the ACF 1180 and become thereby connected to each other by the conductive beads 1181 comprised in the ACF 1180, and the TFT substrate 1111 and the FPC substrate 1170 are fixed to each other by way of an adhesive component 1182 that comprises a thermosetting resin or the like and that is comprised in the ACF 1180.

During thermocompression bonding, pressure is exerted, by way of the conductive beads 1181, onto the external connection terminals 1141 and the corresponding wirings 1171 of the FPC substrate 1170. The contact holes 1131 are present at the region at which the pressure is exerted (region at which the wirings 1171 and the conductive beads 1181 overlap each other). Therefore, pressure is exerted also on the portion of the external connection terminals 1141 that is positioned within the contact holes 1131 and that has ordinarily a small film thickness. In the liquid crystal display device of the present comparative embodiment, as a result, connection faults may occur through crushing of the external connection terminals 1141 at the above-mentioned portion, during thermocompression bonding. When using a conductive member in the form of the conductive beads 1181 comprised in the ACF 1180, in particular, a concern arises in that the external connection terminals 1141 may become cut in the form of a ring, and connection faults may occur frequently.

Figure 15:
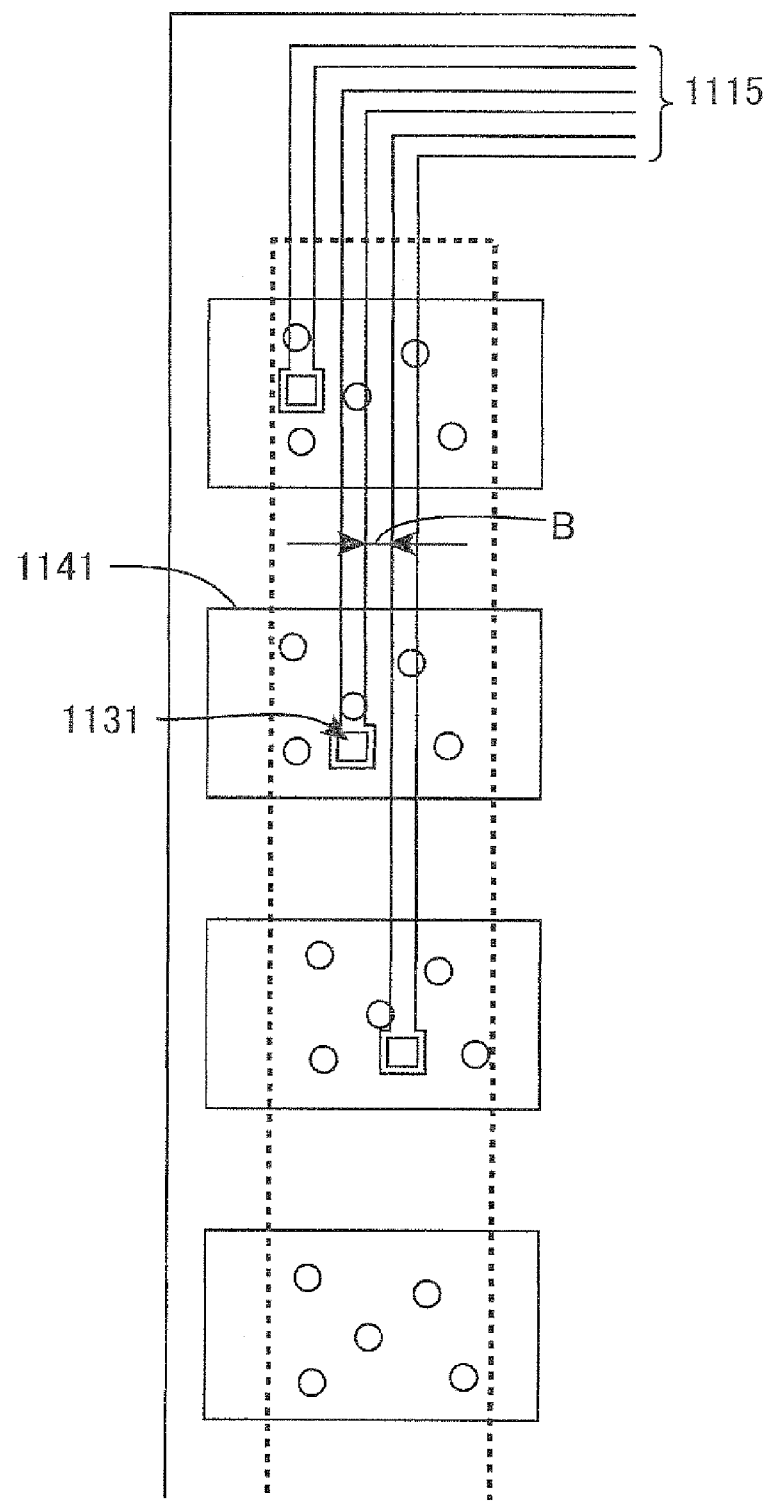
FIG. 15 is a plan-view schematic diagram illustrating a variation of the configuration of the frame section in the liquid crystal display device of Comparative embodiment 1.

FIG. 15 is a plan-view schematic diagram illustrating a variation of the configuration of the frame section in the liquid crystal display device of Comparative embodiment 1. In the present variation, the wiring connection portions of the common wirings 1115 (leading ends of the common wirings 1113) are set to be greater than the width of the common wirings 1115. The contact holes 1131 are also larger than in the above-described Comparative embodiment.

In the current state of the art in mass production technologies, the wiring width and wiring spacing (line and space) of wiring groups, such as the common wirings 1115, can be made as fine as about 2 μm in microfabrication techniques that rely on dry etching. The limits to microfabrication in the case of photolithography using a photosensitive organic insulating film in the form of the interlayer dielectric 1152 that is provided. at a layer above the wiring group, is of about 4 μm. In order to form the contact holes 1131 for connection to the external connection terminals 1141, on the wiring group, it becomes therefore necessary to form the actual contact holes 1131 to a wider width than that of the wiring group, as illustrated in FIG. 15, in view of the position control precision of the contact holes 1131 and in view of the microfabrication precision of the contact holes 1131. Also, the contact holes 1131 are disposed on an extension portion of the wiring group. Therefore, a distance B between common wirings 1115 is greater than a distance A in the case illustrated in FIG. 14-1. Accordingly, fewer wirings can be disposed below the external connection terminals 1141.

The present application claims priority to Patent Application No. 2008-301159 filed in Japan on Nov. 26, 2008 under the Paris Convention and provisions of national law in a designated State, the entire contents of which are hereby incorporated by reference.

EXPLANATION OF REFERENCE NUMERALS 100, 200, 300: liquid crystal display device
111, 211, 311: TFT substrate
112: wiring (lower-layer wiring)
115, 215, 315, 316, 317, 318, 319, 327: common wiring
121, 221, 321: insulating substrate
122, 322: base coat film
123, 323: semiconductor layer
124, 324: gate insulator
125, 325: gate electrode
128, 328: source/drain electrode
129, 329: TFT
130, 330: routing wiring
131, 132, 133, 231, 331, 332, 333, 334: contact hole
141, 142, 143, 241, 341: external connection terminal
146, 346, 347, 348: circuit block
151, 152, 252, 351, 352: interlayer dielectric
161, 361: first wiring layer
162, 262, 362: second wiring layer
163, 263, 363: third wiring layer
164, 264, 364: transparent conductive layer
170, 270, 370: (rigid) FPC 170
171, 271, 371: wiring (FPC wiring)
172, 272, 372: base material
175, 275: IC chip
176, 276: signal input bump
177, 277: signal output bump
180, 280, 380: ACF
181, 281, 381: conductive beads (conductive particles)
182, 282, 382: adhesive component
255: sealing material
256: photo-spacer
257: insulating film
258: glass fibers
265: pixel electrode
266: lower-layer conductive film
267: higher-layer conductive film
313: higher-layer wiring
326: source line
339: high-resistance region
345: ESD (electrostatic discharge) protection circuit

The invention claimed is:

1. A display device comprising:
a display device substrate having an external connection terminal and a lower-layer wiring running below the external connection terminal, an external connection component, and a conductive member that electrically connects the display device substrate and the external connection component, wherein
the external connection component has a connection portion connected to the external connection terminal via the conductive member;
the external connection terminal is in contact with the conductive member;
the display device substrate further has an interlayer dielectric formed at a layer below the external connection terminal, a wiring connection portion that is formed at a layer below the interlayer dielectric and that is connected to the external connection terminal by way of a first connection hole in the interlayer dielectric, and a higher-layer wiring that does not overlap the connection portion, in a plan view of the display device substrate;
the higher-layer wiring is electrically connected to the external connection terminal via the wiring connection portion, overlaps the external connection component, in a plan view of the display device substrate, includes the same conductive layer as a conductive layer that makes up the external connection terminal, and is connected to the lower-layer wiring by way of a second connection hole in the interlayer dielectric; and
the first and second connection holes are disposed outside a region at which the connection portion and the conductive member overlap each other, in a plan view of the display device substrate.

2. The display device according to claim 1, wherein the display device substrate further has an electrostatic discharge protection circuit connected to an electric path between the external connection terminal and the higher-layer wiring.

3. The display device according to claim 2, wherein
the display device substrate further has a thin-film transistor in which a semiconductor layer, a gate insulator and a gate electrode are stacked in this order; and
the lower-layer wiring is electrically connected to the gate electrode.

4. The display device according to claim 1, wherein the display device substrate has a plurality of common wirings including the lower-layer wiring.

5. The display device according to claim 4, wherein the higher-layer wiring intersects the plurality of common wirings.

6. The display device according to claim 4, wherein at least two wirings from among the plurality of common wirings are connected to an electric path between the external connection terminal and the higher-layer wiring.

7. The display device according to claim 1, wherein the external connection terminal is connected to the higher-layer wiring via two or more wiring layers.

8. The display device according to claim 1, wherein the display device further has a sealing material that seals a display element.

9. The display device according to claim 8, wherein the first connection hole is disposed between the sealing material and the region at which the connection portion and the conductive member overlap each other, in a plan view of the display device substrate.

10. The display device according to claim 8, wherein the first connection hole is disposed further toward an inner side of the display device substrate than the sealing material, in a plan view of the display device substrate.

11. The display device according to claim 8, wherein the first connection hole overlaps the sealing material, in a plan view of the display device substrate.

12. The display device according to claim 11, wherein the display device substrate further has a photo-spacer formed in the sealing material.

13. The display device according to claim 11, wherein the display device substrate further has an insulating film formed below the sealing material.

14. The display device according to claim 13, wherein the insulating film is disposed below substantially the entire sealing material.

15. The display device according to claim 1, wherein the conductive member includes conductive particles.

16. The display device according to claim 1, wherein
the display device substrate has a plurality of the first connection holes, the external connection terminals, the wiring connection portions and the lower-layer wirings;
in a plan view of the display device substrate, the plurality of lower-layer wirings run alongside each other crossing the plurality of external connection terminals, and are bent towards a same side with respect to the running direction, in order from an outward lower-layer wiring; and
each of the plurality of wiring connection portions is a portion beyond a bent portion of any of the plurality of lower-layer wirings.

17. The display device according to claim 16, wherein the plurality of first connection holes are provided collinearly in a plan view of the display device substrate.

* * * * *